United States Patent
Kim et al.

(10) Patent No.: US 12,135,854 B2
(45) Date of Patent: Nov. 5, 2024

(54) DISPLAY DEVICE AND ELECTRONIC DEVICE INCLUDING THE SAME

(71) Applicant: SAMSUNG DISPLAY CO., LTD., Yongin-si (KR)

(72) Inventors: Minjoo Kim, Yongin-si (KR); Kicheol Kim, Yongin-si (KR); Mikyung Seo, Yongin-si (KR); Jaeyoon Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/453,295

(22) Filed: Aug. 21, 2023

(65) Prior Publication Data

US 2023/0393695 A1 Dec. 7, 2023

Related U.S. Application Data

(63) Continuation of application No. 17/822,749, filed on Aug. 26, 2022, now Pat. No. 11,733,813, which is a
(Continued)

(30) Foreign Application Priority Data

Feb. 17, 2020 (KR) .......................... 10-2020-0019080

(51) Int. Cl.
*G06F 3/044* (2006.01)
*H10K 59/122* (2023.01)
(Continued)

(52) U.S. Cl.
CPC .......... *G06F 3/0443* (2019.05); *H10K 59/131* (2023.02); *H10K 59/40* (2023.02); *G06F 2203/04112* (2013.01); *H10K 59/122* (2023.02)

(58) Field of Classification Search
CPC ...... G06F 3/0443; G06F 3/044; H10K 59/131; H10K 59/40; H10K 59/122
See application file for complete search history.

(56) References Cited

U.S. PATENT DOCUMENTS 8,624,849 B2   1/2014   Chang et al.
9,239,654 B2   1/2016   Jang
(Continued)

FOREIGN PATENT DOCUMENTS

CN   107831937 A   3/2018
CN   108646952 A   10/2018
(Continued)

OTHER PUBLICATIONS

Chinese Office Action for CN Application No. 202011621160.X, dated Sep. 12, 2024, 13 pages.

*Primary Examiner* — Sardis F Azongha
(74) *Attorney, Agent, or Firm* — Lewis Roca Rothgerber Christie LLP

(57) ABSTRACT

A display device and an electronic device including the same are provided. The display device includes: a display panel including a plurality of first pixels in a first display area and a plurality of second pixels in a second display area and form pixel groups spaced apart from each other with a transmission area therebetween; and a touch sensing layer including a plurality of electrodes on the display panel, wherein each of the plurality of electrodes includes first conductive lines having a mesh pattern, the first conductive lines including a plurality of first openings that respectively correspond to at least one of the first pixels, and at least one of the plurality of electrodes includes second conductive lines having a mesh pattern, the second conductive lines including a plurality of second openings that respectively correspond to at least one of the second pixels.

20 Claims, 14 Drawing Sheets

Related U.S. Application Data continuation of application No. 17/145,687, filed on Jan. 11, 2021, now Pat. No. 11,429,235.

(51) Int. Cl.
*H10K 59/131* (2023.01)
*H10K 59/40* (2023.01)

(56) References Cited

U.S. PATENT DOCUMENTS

| | | |
|---|---|---|
| 10,379,684 B2 | 8/2019 | Ahn et al. |
| 10,733,408 B2 | 8/2020 | Bok |
| 10,756,136 B1 | 8/2020 | Ma et al. |
| 2017/0212613 A1 | 7/2017 | Hwang et al. |
| 2018/0089485 A1 | 3/2018 | Bok |
| 2018/0225500 A1 | 8/2018 | Han |
| 2019/0050078 A1 | 2/2019 | Hamada et al. |
| 2019/0130822 A1 | 5/2019 | Jung et al. |
| 2020/0034598 A1 | 1/2020 | Wu et al. |
| 2020/0312832 A1 | 10/2020 | Chi et al. |
| 2020/0343325 A1 | 10/2020 | Cai et al. |
| 2021/0020701 A1 | 1/2021 | Zheng |
| 2021/0020706 A1 | 1/2021 | Chen |
| 2021/0191548 A1 | 6/2021 | Huang et al. |

FOREIGN PATENT DOCUMENTS

| | | |
|---|---|---|
| CN | 109004007 A | 12/2018 |
| CN | 109950288 A | 6/2019 |
| CN | 109962092 A | 7/2019 |
| CN | 110047852 A | 7/2019 |
| CN | 110310977 A | 10/2019 |
| KR | 10-1356336 B1 | 1/2014 |
| KR | 10-1373044 B1 | 3/2014 |
| KR | 10-2017-0113066 A | 10/2017 |
| KR | 10-2017-0116319 A | 10/2017 |
| KR | 10-2018-0092003 A | 8/2018 |

DISPLAY DEVICE AND ELECTRONIC DEVICE INCLUDING THE SAME

CROSS-REFERENCE TO RELATED APPLICATIONS

This application is a continuation of U.S. patent application Ser. No. 17/822,749, filed Aug. 26, 2022, which is a continuation of U.S. patent application Ser. No. 17/145,687, filed Jan. 11, 2021, now U.S. Pat. No. 11,429,235, which claims priority to and the benefit of Korean Patent Application No. 10-2020-0019080, filed Feb. 17, 2020, the entire content of all of which is incorporated herein by reference.

BACKGROUND

1. Field

Aspects of one or more example embodiments relate to a display device and an electronic device including the same.

2. Description of Related Art

Recently, the various uses of display devices has become more diversified. In addition, as display devices have become thinner and lighter, their ranges of use has gradually expanded.

As display devices are used in various ways and for various applications, they have been designed to have various shapes and structures. Also, functions that may be combined or associated with the display devices are increasing.

The above information disclosed in this Background section is only for enhancement of understanding of the background and therefore the information discussed in this Background section does not necessarily constitute prior art.

SUMMARY

Aspects of one or more example embodiments relate to a display device and an electronic device including the same, and for example, to a display device having an extended display area to display an image even in an area where an electronic component is arranged, and an electronic device including the same.

As ways of increasing functions that may be combined or associated with display devices, one or more example embodiments may include a display device including a relatively extended display area for displaying images even in an area where an electronic component is arranged, and an electronic device including the same. For example, one or more example embodiments may include a display device capable of obtaining information according to an external input even in a region where an electronic component is arranged, and an electronic device including the same. However, the above technical characteristics are examples, and the scope of example embodiments according to the present disclosure are not limited thereto.

Additional aspects will be set forth in part in the description which follows and, in part, will be more apparent from the description, or may be learned by practice of the presented example embodiments of the disclosure.

According to one or more example embodiments, a display device includes: a display panel including a plurality of first pixels that are arranged in a first display area and a plurality of second pixels that are arranged in a second display area and form pixel groups spaced apart from each other with a transmission area therebetween; and a touch sensing layer including a plurality of electrodes arranged on the display panel, wherein each of the plurality of electrodes includes first conductive lines having a mesh pattern, the first conductive lines including a plurality of first openings that respectively correspond to at least one of the first pixels, and at least one of the plurality of electrodes includes second conductive lines having a mesh pattern, the second conductive lines including a plurality of second openings that respectively correspond to at least one of the second pixels, wherein one of the second conductive lines extends between adjacent pixel groups in a first direction or a second direction intersecting with the first direction.

According to some example embodiments, the first conductive lines may be located between two adjacent first pixels among the first pixels, and the second conductive lines may be located between two adjacent second pixels among the second pixels.

According to some example embodiments, the plurality of electrodes may include: first electrodes arranged in the first direction; and second electrodes arranged in the second direction intersecting with the first direction.

According to some example embodiments, the display panel may further include at least one first wire extending in the first direction and at least one second wire extending in the second direction intersecting with the first direction, and the one of the second conductive lines may be arranged to at least partially overlap the at least one first wire or the at least one second wire.

According to some example embodiments, the first wire may include a data line, and the second wire may include a scan line.

According to some example embodiments, the pixel groups formed by the plurality of second pixels may include a first group of second pixels and a second group of second pixels that are spaced apart from each other with the transmission area therebetween, the second conductive lines may include: a first group of second conductive lines located between at least two second pixels among the first group of second pixels; and a second group of second conductive lines located between at least two second pixels among the second group of second pixels, and the one of the second conductive lines may extend between the first group of second conductive lines and the second group of second conductive lines to connect the first group of second conductive lines to the second group of second conductive lines.

According to some example embodiments, the pixel groups formed by the plurality of second pixels may further include a third group of second pixels and a fourth group of second pixels that are arranged in a first direction, the second conductive lines may include: a third group of second conductive lines located between at least two second pixels among the third group of second pixels; and a fourth group of second conductive lines located between at least two second pixels among the fourth group of second pixels, and the first group of second pixels and the second group of second pixels may be arranged in a second direction different from the first direction.

According to some example embodiments, the touch sensing layer may further include a connection conductive line configured to electrically connect the third group of second conductive lines to the fourth group of second conductive lines.

According to some example embodiments, the display device may further include an insulating layer between the third group of second conductive lines and the connection conductive line and between the fourth group of second conductive lines and the connection conductive line, wherein the connection conductive line may be respectively connected to the third group of second conductive lines and the fourth group of second conductive lines through contact holes of the insulating layer.

According to some example embodiments, the display panel may further include at least one first wire extending in the first direction and at least one second wire extending in the second direction, and the connection conductive line is arranged to at least partially overlap the at least one first wire.

According to some example embodiments, the display panel may further include a first wiring area corresponding to an area where the at least one first wire is located, and the connection conductive line may be arranged to overlap the first wiring area.

According to some example embodiments, the display panel may further include a second wiring area corresponding to an area where the at least one second wire is located, and the one of the second conductive lines may be arranged to overlap the second wiring area.

According to some example embodiments, a width of the connection conductive line may be less than a width of the first wiring area.

According to some example embodiments, the first group of second pixels or the second group of second pixels may be arranged between the third group of second pixels and the fourth group of second pixels, and the connection conductive line may overlap the first group of second pixels or the second group of second pixels.

According to some example embodiments, a width of the second conductive line may be greater than a width of the first conductive line.

According to some example embodiments, the number of the second pixels per the same area may be less than the number of the first pixels per the same area.

According to some example embodiments, the plurality of electrodes may each include a metal layer.

According to some example embodiments, the first conductive line and the second conductive line may include the same material.

According to some example embodiments, the connection conductive line may include the same material as the second conductive line.

According to one or more example embodiments, an electronic device includes: a display device including a first display area and a second display area that have different resolutions; and an electronic component overlapping a transmission area included in the second display area, wherein the display device includes: a display panel including a plurality pixels, the plurality of pixels including a plurality of first pixels that define the first display area, and a plurality of second pixels that form pixel groups spaced apart from each other with the transmission area therebetween, and define the second display area; and a touch sensing layer including a plurality of electrodes arranged on the display panel, wherein the plurality of electrodes include first conductive lines having a mesh pattern, the first conductive lines including a plurality of first openings that respectively correspond to at least one of the first pixels, at least one of the plurality of electrodes includes second conductive lines having a mesh pattern, the second conductive lines including a plurality of second openings that respectively correspond to at least one of the second pixels, and one of the second conductive lines extends between adjacent pixel groups in a first direction or a second direction intersecting with the first direction.

According to some example embodiments, the display panel may further include: a pixel electrode; an intermediate layer arranged on the pixel electrode; an opposite electrode arranged on the intermediate layer; and a pixel-defining layer covering edges of the pixel electrode, the first conductive lines may be arranged to overlap a pixel-defining layer located in the first display area, and the second conductive lines may be arranged to overlap a pixel-defining layer located in the second display area.

According to some example embodiments, the plurality of electrodes may include: first electrodes arranged in the first direction; and second electrodes arranged in the second direction intersecting with the first direction.

According to some example embodiments, the display panel may further include at least one first wire extending in the first direction and at least one second wire extending in the second direction intersecting with the first direction, and the one of the second conductive lines is arranged to at least partially overlap the at least one first wire or the at least one second wire.

According to some example embodiments, the pixel groups formed by the plurality of second pixels may include a first group of second pixels and a second group of second pixels that are spaced apart from each other with the transmission area therebetween, the second conductive lines may include: a first group of second conductive lines located between at least two second pixels among the first group of second pixels; and a second group of second conductive lines located between at least two second pixels among the second group of second pixels, and the one of the second conductive lines may extend between the first group of second conductive lines and the second group of second conductive lines to connect the first group of second conductive lines to the second group of second conductive lines.

According to some example embodiments, the pixel groups formed by the plurality of second pixels may further include a third group of second pixels and a fourth group of second pixels that are arranged in a first direction, the second conductive lines may include: a third group of second conductive lines located between at least two second pixels among the third group of second pixels; and a fourth group of second conductive lines located between at least two second pixels among the fourth group of second pixels, and the first group of second pixels and the second group of second pixels may be arranged in a second direction different from the first direction.

According to some example embodiments, the touch sensing layer may further include a connection conductive line configured to electrically connect the third group of second conductive lines to the fourth group of second conductive lines.

According to some example embodiments, the touch sensing layer may further include an insulating layer between the third group of second conductive lines and the connection conductive line and between the fourth group of second conductive lines and the connection conductive line, and the connection conductive line may be respectively connected to the third group of second conductive lines and the fourth group of second conductive lines through contact holes of the insulating layer.

According to some example embodiments, a width of the second conductive line may be greater than a width of the first conductive line.

According to some example embodiments, the electronic component may include an imaging device or a sensor.

These and/or other aspects will become more apparent and more readily appreciated from the following description of the example embodiments, the accompanying drawings, and claims.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
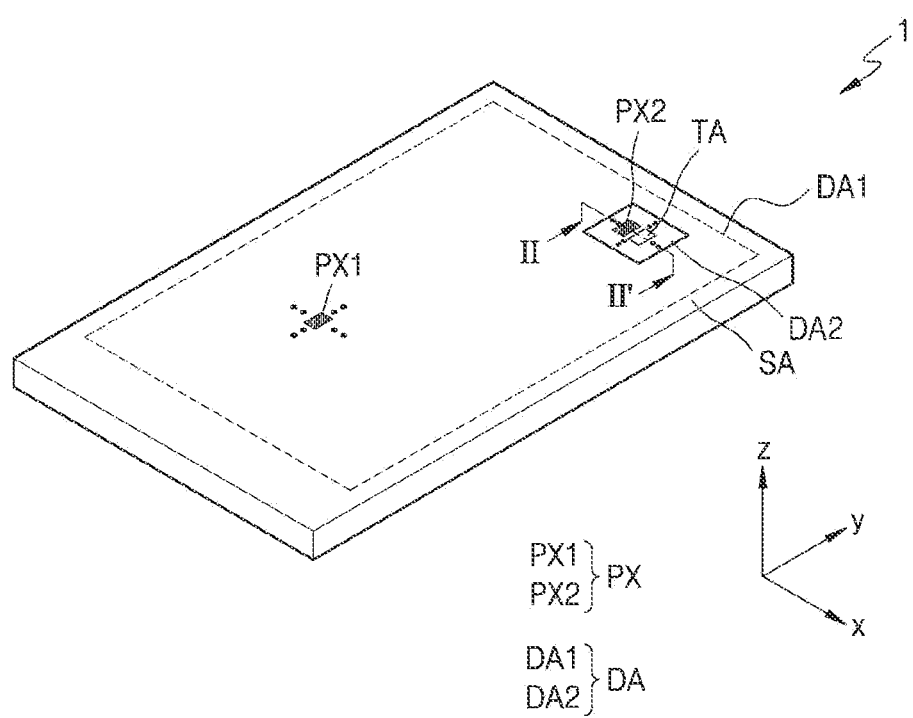
FIG. 1 is a schematic perspective view of a display device according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, aspects of some example embodiments are described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present example embodiments are described in more detail with reference to the accompanying drawings. Like reference numerals in the drawings denote like elements, and repeated description thereof is omitted.

It will be understood that although the terms "first," "second," etc. may be used herein to describe various elements, these elements should not be limited by these terms. These terms are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on," another layer, region, or element, it can be directly or indirectly formed on the other layer, region, or element. That is, for example, intervening layers, regions, or elements may be present.

Sizes of elements in the drawings may be exaggerated or reduced for convenience of explanation. In other words, because sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present specification, "A and/or B" means A or B, or A and B. In addition, "at least one of A and B" means A or B, or A and B.

It will be understood that when a layer, region, or element is referred to as being "connected" to another layer, region, or element, it may be "directly connected" to the other layer, region, or element and/or may be "indirectly connected" to the other layer, region, or element with other layer, region, or element interposed therebetween. For example, it will be understood that when a layer, region, or element is referred to as being "electrically connected" to another layer, region, or element, it may be "directly electrically connected" to the other layer, region, or element, or may be "indirectly electrically connected" to other layer, region, or element with other layer, region, or element interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display device 1 according to some example embodiments.

Referring to FIG. 1, the display device 1 includes a first display area DA1, a second display area DA2, and a surrounding area SA, the first display area DA1 and the second display area DA2 each emitting light, and the surrounding area SA not emitting light. The second display area DA2 may be arranged adjacent to the first display area DA1, and the surrounding area SA may arranged outside the first display area DA1.

According to some example embodiments, it is shown in FIG. 1 that one second display area DA2 is arranged inside the first display area DA1. According to some example embodiments, however, the number of second display areas DA2 may be two or more, and shapes and sizes of the second display areas DA2 provided in plural may be different from each other. The surrounding area SA may be a non-display area where pixels are not arranged. The first display area DA1 may be entirely or partially surrounded by the surrounding area SA.

Though it is shown in FIG. 1 that the second display area DA2 is approximately quadrangular, the embodiments are not limited thereto. In a plan view (when viewed in a direction perpendicular to one surface of a substrate), a shape of each of the second display areas DA2 may be variously modified such as a circle, an ellipse, a polygon including a quadrangle, a star, and a diamond.

In addition, though it is shown in FIG. 1 that the second display area DA2 is arranged on one side (a top right side) of the first display area DA1, which has a quadrangular shape, the embodiments are not limited thereto. According to some example embodiments, the second display area DA2 may be arranged on one side (e.g. a top left side or a top center) of the first display area DA1, which has a quadrangular shape.

Furthermore, though it is shown in FIG. 1 that the second display area DA2 is entirely surrounded by the first display area DA1, the embodiments are not limited thereto. According to some example embodiments, the second display area DA2 may be partially surrounded by the first display area DA1, and a side of the second display area DA2 that is not surrounded by the first display area DA1 may be surrounded by the surrounding area SA.

Hereinafter, though the display device 1 according to some example embodiments is described as including an organic light-emitting display panel as an example, the display device 1 according to some example embodiments is not limited thereto. For example, according to some example embodiments, the display device 1 may include various other types of display devices or light emitting components, such as inorganic light-emitting display panels and quantum dot light-emitting display panels. For example, an emission layer of a display element provided to a display panel 10 may include an organic material, an inorganic material, quantum dots, an organic material and quantum dots, or an inorganic material and quantum dots.

The display device 1 may provide a certain image by using light emitted from a plurality of pixels PX arranged in the first display area DA1 and the second display area DA2. A first pixel array in which first pixels PX1 are two-dimensionally arranged may be positioned in the first display area DA1, and a second pixel array in which second pixels PX2 are two-dimensionally arranged may be positioned in the second display area DA2.

The display device 1 may display a first image (or a main image) by using light emitted from the first pixels PX1 arranged in the first display area DA1, and may display a second image (or an auxiliary image) by using light emitted from the second pixels PX2 arranged in the second display area DA2. The first image and the second image may correspond to portions of the same image or may be independent images. According to some example embodiments, a resolution of the second image provided in the second display area DA2 may be less than a resolution of the first image provided in the first display area DA1.

The display device 1 may include an electronic component located in the second display area DA2, and the second display area DA2 may include a transmission area TA for driving of the electronic component.

Figure 2:
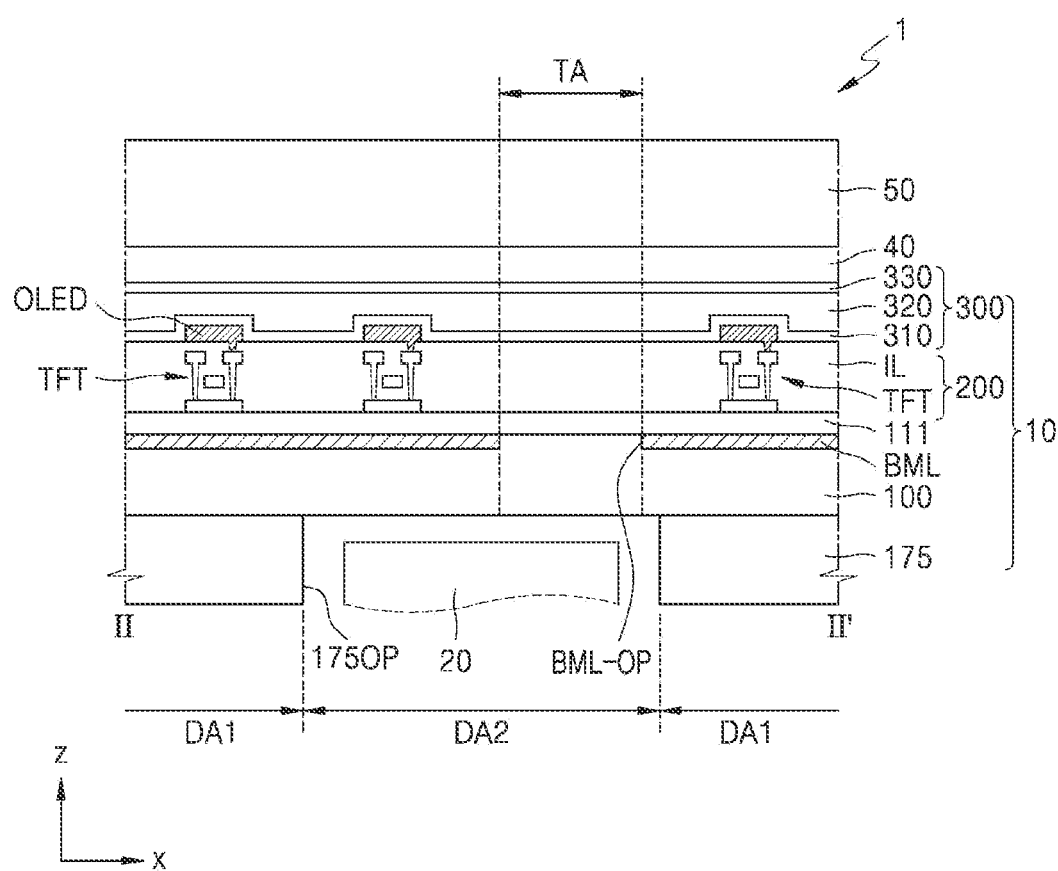
FIG. 2 is a schematic cross-sectional view of a portion of a display device according to some example embodiments.

FIG. 2 is a schematic cross-sectional view of a portion of the display device 1 according to some example embodiments.

Referring to FIG. 2, the display device 1 may include the display panel 10 and an electronic component 20 overlapping the display panel 10.

The display panel 10 may include the substrate 100, a display layer 200 on the substrate 100, a thin-film encapsulation layer 300 on the display layer 200, a touch sensing layer 40, an optical functional layer 50, and a light-blocking layer BML.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 including the polymer resin may be flexible, rollable, or bendable. The substrate 100 may have a multi-layered structure including a layer including the polymer resin, and an inorganic layer.

The display layer 200 may be arranged on a first surface (e.g., a top surface) of the substrate 100, and a bottom protective film 175 may be arranged on a second surface (e.g., a bottom surface) opposite to the first surface of the substrate 100. The bottom protective film 175 may be attached on the second surface of the substrate 100. An adhesive layer may be arranged between the bottom protective film 175 and the substrate 100. Alternatively, the bottom protective film 175 may be directly formed on the second surface of the substrate 100. In this case, an adhesive layer may not be arranged between the bottom protective film 175 and the substrate 100.

The bottom protective film 175 may support and protect the substrate 100. The bottom protective film 175 may include an opening 1750P corresponding to the second display area DA2. The bottom protective film 175 may improve a transmittance of the second display area DA2, for example, a light transmittance of the transmission area TA, by including the opening 1750P. The bottom protective film 175 may include polyethylene terephthalate (PET) or polyimide (PI).

The display layer 200 may include a circuit layer, a display element layer, and an insulating layer IL, the circuit layer including a thin-film transistor TFT, and the display element layer including an organic light-emitting diode OLED, which is a display element. The thin-film transistor TFT and an organic light-emitting diode OLED electrically connected to the thin-film transistor TFT may be arranged in each of the first display area DA1 and the second display area DA2. The second display area DA2 may include the transmission area TA where the thin-film transistor TFT and the organic light-emitting diode OLED are not arranged.

The transmission area TA is a region through which light output from the electronic component 20 and/or directed to the electronic component 20 may pass. A transmittance of the transmission area TA may about 50% or more, about 60% or more, about 75% or more, about 80% or more, about 85% or more, or about 90% or more.

The thin-film encapsulation layer 300 may include at least one inorganic encapsulation layer and at least one organic encapsulation layer. According to some example embodiments, the thin-film encapsulation layer 300 may include first and second inorganic encapsulation layers 310 and 330 and an organic encapsulation layer 320 therebetween.

The touch sensing layer 40 may obtain coordinate information according to an external input, for example, a touch event. The touch sensing layer 40 may include sensing electrodes and signal lines connected to the sensing electrodes. The touch sensing layer 40 may sense an external input in a mutual cap manner or a self cap manner.

The touch sensing layer 40 may be formed on the thin-film encapsulation layer 300. Alternatively, the touch sensing layer 40 may be separately formed and then coupled to the thin-film encapsulation layer 300 through an adhesive layer such as an optically clear adhesive (OCA). According to some example embodiments, as shown in FIG. 2, the touch sensing layer 40 may be directly formed on the thin-film encapsulation layer 300. In this case, the adhesive layer may not be arranged between the touch sensing layer 40 and the thin-film encapsulation layer 300.

The optical functional layer 50 may be formed on the touch sensing layer 40. The optical functional layer 50 may include an anti-reflection layer. The anti-reflection layer may reduce a reflectivity of light (external light) incident toward the display panel 10 from the outside.

A light-blocking layer BML may be arranged between the substrate 100 and the display layer 200. For example, the light-blocking layer BML may be arranged, for example, between the thin-film transistor TFT and the substrate 100.

The light-blocking layer BML may include an opening BML-OP corresponding to the transmission area TA. The light-blocking layer BML may define the opening BML-OP and include a portion including a light-blocking material, for example, a metal or black ink, etc., provided to the light-blocking layer BML. The portion of the light-blocking layer BML including the light-blocking material may be arranged to cover the first display area DA1 and a portion of the second display area DA2. A portion of the light-blocking layer BML that covers the first display area DA1 and a portion of the light-blocking layer BML that covers a portion of the second display area DA2 may be connected to each other as one body. For example, the light-blocking layer BML may be arranged to correspond to the first display area DA1 of the display panel 10 and an entire region of the second display area DA2 except for the transmission area TA.

As shown in FIG. 2, the light-blocking layer BML may be arranged on the substrate 100. Alternatively, the light-blocking layer BML may be arranged in a multi-layered structure of the substrate 100. For example, the light-blocking layer BML may be arranged between a plurality of sub-layers constituting the substrate 100. The light-blocking layer BML is not an essential element and may be omitted according to embodiments.

The electronic component 20 may be located in the second display area DA2. The electronic component 20 may include an electronic element that uses light or sound. For example, the electronic element may include a sensor measuring a distance such as a proximity sensor, a sensor recognizing a portion (e.g., a fingerprint, an iris, a face, etc.) of a user's body, a small lamp outputting light, or an image sensor (e.g., a camera) that captures an image. The electronic element that uses light may use light in various wavelength bands including visible light, infrared light, and ultraviolet light. The electronic element that uses sound may use ultrasonic waves or sound in other frequency bands.

One electronic component 20 or a plurality of electronic components 20 may be arranged in the second display area DA2. According to some example embodiments, the electronic component 20 may include a light emitter and a light receiver. The light emitter and the light receiver may be provided as one integrated structure or a pair of light emitter and light receiver respectively having physically separated structures may constitute one electronic component 20.

Figure 3:
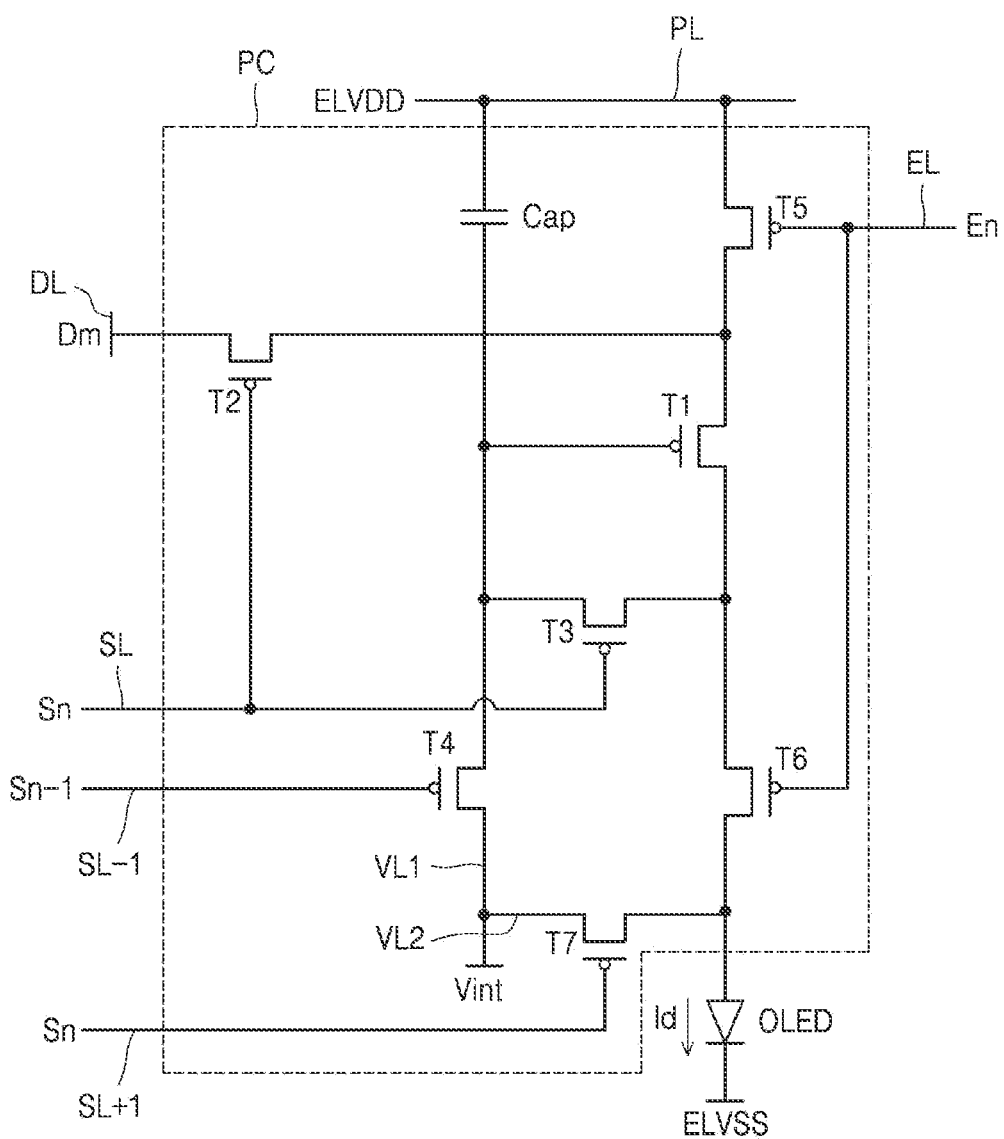
FIG. 3 is an equivalent circuit diagram of a pixel circuit included in a display device according to some example embodiments.

FIG. 3 is an equivalent circuit diagram of a pixel circuit PC included in the display device 1 according to some example embodiments.

Referring to FIG. 3, the display panel 10 includes the pixel circuit PC including a plurality of thin-film transistors T1, T2, T3, T4, T5, T6, and T7 and a storage capacitor Cap. In addition, the display panel 10 may include an organic light-emitting diode OLED as an emission element, the organic light-emitting diode OLED emitting light by receiving a driving voltage from the pixel circuit PC.

The pixel circuit PC may include a plurality of thin-film transistors and a storage capacitor. According to some example embodiments, as shown in FIG. 3, the thin-film transistors may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7. According to some example embodiments, the pixel circuit PC may include additional components, or fewer components, and the structure of the pixel circuit PC may vary without departing from the spirit and scope of embodiments according to the present disclosure.

A gate electrode of the driving thin-film transistor T1 is connected to an electrode of the storage capacitor Cap, one of a source electrode and a drain electrode of the driving thin-film transistor T1 is connected to a driving voltage line PL through the operation control thin-film transistor T5, and the other of the source electrode and the drain electrode of the driving thin-film transistor T1 is electrically connected to a pixel electrode of the organic light-emitting diode OLED through the emission control thin-film transistor T6. The driving thin-film transistor T1 is configured to receive a data signal Dm depending on a switching operation of the switching thin-film transistor T2 and supply a driving current Id to the organic light-emitting diode OLED.

A gate electrode of the switching thin-film transistor T2 is connected to a first scan line SL, one of a source electrode and a drain electrode of the switching thin-film transistor T2 is connected to a data line DL, and the other of the source electrode and the drain electrode of the switching thin-film transistor T2 is connected to the driving thin-film transistor T1 and the driving voltage line PL through the operation control thin-film transistor T5. The switching thin-film transistor T2 is turned on in response to a scan signal Sn transferred through the first scan line SL and is configured to perform a switching operation of transferring a data signal Dm transferred through the data line DL to the driving thin-film transistor T1.

A gate electrode of the compensation thin-film transistor T3 is connected to the first scan line SL, one of a source electrode and a drain electrode of the compensation thin-film transistor T3 is connected to the driving thin-film transistor T1 and the pixel electrode of the organic light-emitting diode OLED through the emission control thin-film transistor T6, and the other of the source electrode and the drain electrode of the compensation thin-film transistor T3 is connected to an electrode of the storage capacitor Cap, the first initialization thin-film transistor T4, and the driving thin-film transistor T1. The compensation thin-film transistor T3 is turned on in response to a scan signal Sn transferred through the first scan line SL and is configured to diode-connect the driving thin-film transistor T1 by electrically connecting the gate electrode of the driving thin-film transistor T1 to one (e.g., the drain electrode) of the source electrode and the drain electrode of the driving thin-film transistor T1.

A gate electrode of the first initialization thin-film transistor T4 is connected to a second scan line SL−1, one of a source electrode and a drain electrode of the first initialization thin-film transistor T4 is connected to a first initialization voltage line VL1, and the other of the source electrode and the drain electrode of the first initialization thin-film transistor T4 is connected to the electrode of the storage capacitor Cap, the compensation thin-film transistor T3, and the driving thin-film transistor T1. The first initialization thin-film transistor T4 is turned on in response to a previous scan signal Sn−1 transferred through the second scan line SL−1 and is configured to perform an initialization operation of initializing a voltage of the gate electrode of the driving thin-film transistor T1 by transferring an initialization voltage Vint to the gate electrode of the driving thin-film transistor T1.

A gate electrode of the operation control thin-film transistor T5 is connected to an emission control line EL, one of a source electrode and a drain electrode of the operation control thin-film transistor T5 is connected to the driving voltage line PL, and the other of the source electrode and the drain electrode of the operation control thin-film transistor T5 is connected to the driving thin-film transistor T1 and the switching thin-film transistor T2.

A gate electrode of the emission control thin-film transistor T6 is connected to the emission control line EL, one of a source electrode and a drain electrode of the emission control thin-film transistor T6 is connected to the driving thin-film transistor T1 and the compensation thin-film transistor T3, and the other of the source electrode and the drain electrode of the emission control thin-film transistor T6 is electrically connected to the second initialization thin-film transistor T7 and the pixel electrode of the organic light-emitting diode OLED.

The operation control thin-film transistor T5 and the emission control thin-film transistor T6 are simultaneously turned on in response to an emission control signal En transferred through the emission control line EL to allow a driving voltage ELVDD to be transferred to the organic light-emitting diode OLED, and thus, the driving current Id to flow through the organic light-emitting diode OLED.

A gate electrode of the second initialization thin-film transistor T7 may be connected to a third scan line SL+1 of a pixel arranged on the next row of a corresponding pixel PX. In addition, one of a source electrode and a drain electrode of the second initialization thin-film transistor T7 is connected to the emission control thin-film transistor T6 and the pixel electrode of the organic light-emitting diode OLED, and the other of the source electrode and the drain electrode of the second initialization thin-film transistor T7 is connected to a second initialization voltage line VL2.

The first scan line SL may be electrically connected to the third scan line SL+1, and thus, the same scan signal Sn may be applied to the third scan line SL+1. Therefore, the second initialization thin-film transistor T7 may be turned on in response to a scan signal Sn transferred through the third scan line SL+1 and may perform an operation of initializing the pixel electrode of the organic light-emitting diode OLED.

In another example, the first initialization thin-film transistor T4 and the second initialization thin-film transistor T7 may be simultaneously connected to the second scan line SL−1.

One electrode of the storage capacitor Cap is connected to the driving voltage line PL, and an opposite electrode of the organic light-emitting diode OLED is connected to a common voltage ELVSS. Therefore, the organic light-emitting diode OLED may display an image by receiving the driving current Id from the driving thin-film transistor T1 and emitting light.

Though it is shown in FIG. 3 that the pixel circuit PC includes seven thin-film transistors T1, T2, T3, T4, T5, T6, and T7 and one storage capacitor Cap, the embodiments according to the present disclosure are not limited thereto. The number of thin-film transistors and the number of storage capacitors may be variously modified depending on the design of the pixel circuit PC.

Figure 4:
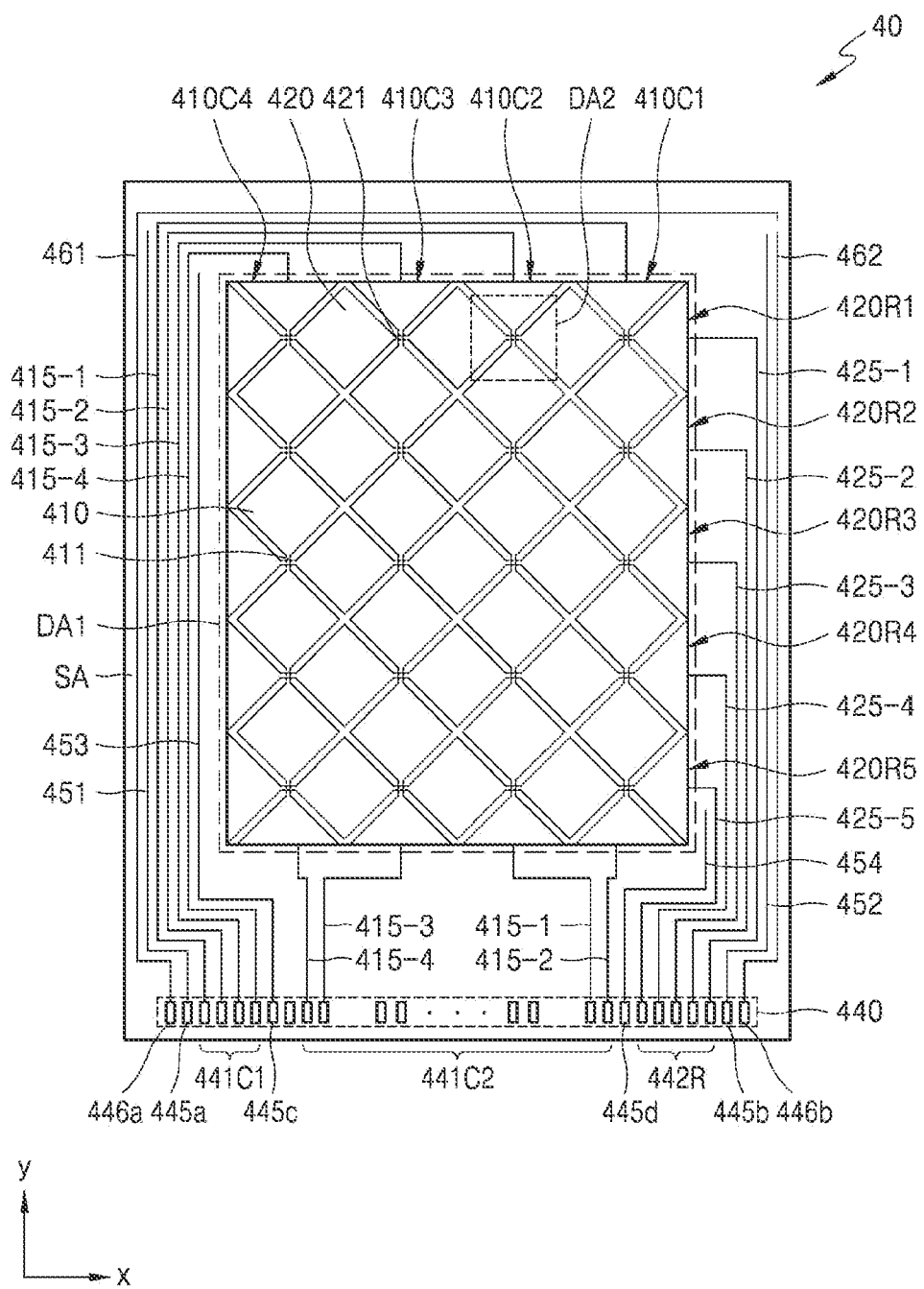
FIG. 4 is a schematic plan view of a touch sensing layer included in a display device according to some example embodiments.

FIG. 4 is a schematic plan view of a touch sensing layer 40 included in the display device 1 according to some example embodiments.

Referring to FIG. 4, the touch sensing layer 40 may include a plurality of electrodes and signal lines. More specifically, the touch sensing layer 40 may include a plurality of electrodes including first sensing electrodes 410, first connection electrodes 411, second sensing electrodes 420, and second connection electrodes 421, and signal lines including first signal lines 415-1, 415-2, 415-3, and 415-4 respectively connected to the first sensing electrodes 410 and second signal lines 425-1, 425-2, 425-3, 425-4, and 425-5 respectively connected to the second sensing electrodes 420.

The first sensing electrodes 410 may be arranged in a y-direction, and the second sensing electrodes 420 may be arranged in an x-direction intersecting with the y-direction. The first sensing electrodes 410 arranged in the y-direction may be connected to each other by a first connection electrode 411 between adjacent first sensing electrodes 410, and may form first sensing lines 410C1, 410C2, 410C3, and 410C4. The second sensing electrodes 420 arranged in the x-direction may be connected to each other by a second connection electrode 421 between adjacent second sensing electrodes 420, and may form second sensing lines 420R1, 420R2, 420R3, 420R4, and 420R5. The first sensing lines 410C1 to 410C4 and the second sensing lines 420R1 to 420R5 may intersect each other. For example, the first sensing lines 410C1 to 410C4 and the second sensing lines 420R1 to 420R5 may be perpendicular to each other.

The first sensing lines 410C1 to 410C4 may be connected to pads of a sensing signal pad unit 440 through the first signal lines 415-1 to 415-4 formed in the surrounding area SA. For example, each of the first signal lines 415-1 to 415-4 may have a double routing structure in which the first signal lines 415-1 to 415-4 are respectively connected to upper and lower sides of the first sensing lines 410C1 to 410C4. Each of the first signal lines 415-1 to 415-4 respectively connected to the upper and lower sides of the first sensing lines 410C1 to 410C4 may be connected to corresponding first pads 441C1 and 441C2.

The second sensing lines 420R1 to 420R5 may be connected to the pads of the sensing signal pad unit 440 through the second signal lines 425-1 to 425-5 formed in the surrounding area SA. For example, each of the second signal lines 425-1 to 425-5 may be connected to a corresponding second pad 442R.

A ground line may be arranged in the surrounding area SA to prevent damage caused by static electricity introduced into the touch sensing layer 40 from the outside, for example, static electricity introduced into the surrounding area SA. In this regard, FIG. 4 illustrates a first ground line 461 extending along a left side and an upper side of the surrounding area SA and a second ground line 462 extending along a right side of the surrounding area SA. The first and second ground lines 461 and 462 may be spaced apart from each other by a certain interval. In this regard, it is shown in FIG. 4 that the first and second ground lines 461 and 462 are spaced apart from each other in an area of the surrounding area SA adjacent to an upper right side of a display area DA. The first and second ground lines 461 and 462 may be connected to corresponding pads 446a and 446b, respectively. Each of the first and second ground lines 461 and 462 may have a voltage level of a constant voltage (e.g., a zero voltage, a negative direct-current (DC) voltage, or a positive DC voltage). The first and second ground lines 461 and 462 may have constant voltages of different levels or constant voltages of the same level.

Guard lines may be arranged around a group of the first signal lines 415-1 to 415-4 and a group of the second signal lines 425-1 to 425-5 in order to prevent interference between adjacent lines or wires. For example, as shown in FIG. 4, a first guard line 451 may be located between the first ground line 461 and a group of upper first signal lines 415-1 to 415-4. A second guard line 452 may be located between the second ground line 462 and the group of the second signal lines 425-1 to 425-5. A third guard line 453 may be located between the group of the upper first signal lines 415-1 to 415-4 and a group of lower first signal lines 415-1 to 415-4, and a fourth guard line 454 may be located between the group of the lower first signal lines 415-1 to 415-4 and the group of the second signal lines 425-1 to 425-5. The first to fourth guard lines 451, 452, 453, and 454 may be connected to corresponding pads 445a, 445b, 445c and 445d, respectively. Each of the first to fourth guard lines 451, 452, 453, and 454 may have a voltage level of a constant voltage. For example, the first to fourth guard lines 451, 452, 453, and 454 may have constant voltages of different levels or constant voltages of the same level.

Although FIG. 4 illustrates a double routing structure in which the first signal lines 415-1 to 415-4 are respectively connected to the upper and lower sides of the first sensing lines 410C1 to 410C4, the embodiments according to the present disclosure are not limited thereto. According to some example embodiments, the first signal lines 415-1 to 415-4 may be connected only to the upper side or the lower side of the first sensing lines 410C1 to 410C4.

Figure 5:
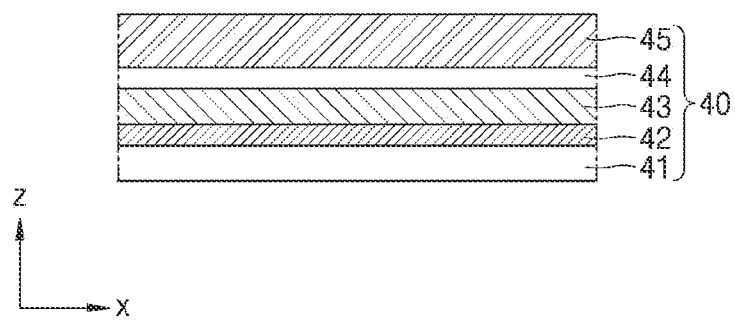
FIG. 5 is a schematic cross-sectional view of a stacked structure of a touch sensing layer included in a display device according to some example embodiments.

FIG. 5 is a schematic cross-sectional view of a stacked structure of the touch sensing layer 40 according to some example embodiments.

Referring to FIG. 5, the touch sensing layer 40 may include a first conductive layer 42 and a second conductive layer 44. A first insulating layer 41 may be arranged under the first conductive layer 42, a second insulating layer 43 may be arranged between the first conductive layer 42 and the second conductive layer 44, and a third insulating layer 45 may be arranged on the second conductive layer 44. Each of the first sensing electrodes 410, the first connection electrodes 411, the second sensing electrodes 420, and the second connection electrodes 421 described with reference to FIG. 4 may be included in one of the first conductive layer 42 and the second conductive layer 44.

The first and second conductive layers 42 and 44 may include a metal layer or a transparent conductive layer. The metal layer may include molybdenum (Mo), mendelevium (Md), silver (Ag), titanium (Ti), copper (Cu), aluminum (Al), or an alloy thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as poly(3,4-ethylenedioxythiophene) (PEDOT), a metal nanowire, graphene, etc.

Each of the first and second conductive layers 42 and 44 may be single-layered or multi-layered. The first and second conductive layers 42 and 44 each including a single layer may include a single metal layer or a single transparent conductive layer, and materials of the metal layer and the transparent conductive layer are as described above. One of the first and second conductive layers 42 and 44 may include a single metal layer. The single metal layer may include a Mo layer or an alloy layer of MoMb.

One of the first and second conductive layers 42 and 44 may include a multi-layered metal layer. The multi-layered metal layer may include, for example, three layers of a Ti layer/an Al layer/a Ti layer, or two layers of a Mo layer/a Mb layer. Alternatively, the multi-layered metal layer may include a metal layer and a transparent conductive layer. The first and second conductive layers 42 and 44 may have different stacked structures or the same stacked structure. For example, the first conductive layer 42 may include a metal layer, and the second conductive layer 44 may include a transparent conductive layer. Alternatively, the first and second conductive layers 42 and 44 may include the same metal layer.

Materials of the first and second conductive layers 42 and 44 and arrangements of the sensing electrodes (410 and 420 of FIG. 4) provided in the first and second conductive layers 42 and 44 may be determined considering sensing sensitivity. A resistive-capacitive (RC) delay may affect the sensing sensitivity, and a resistance of each sensing electrode including the metal layer is less than a resistance of the transparent conductive layer, thereby reducing an RC value. Thus, the charging time of a capacitor defined between the sensing electrodes may be shortened. The sensing electrodes including the transparent conductive layer may not be visible to a user as compared with the metal layer, and an input area may be increased to increase capacitance.

Each of the first to third insulating layers 41, 43, and 45 may include an inorganic insulating material and/or an organic insulating material. The inorganic insulating material may include silicon oxide, silicon nitride, or silicon oxynitride, and the organic insulating material may include a polymer organic material.

Some of the first and second sensing electrodes 410 and 420 and the first and second connection electrodes 411 and 421 described with reference to FIG. 4 may be arranged on the first conductive layer 42, and the others may be arranged on the second conductive layer 44.

According to some example embodiments, the first conductive layer 42 may include the first connection electrodes 411 (see FIG. 4), and the second conductive layer 44 may include the first and second sensing electrodes 410 and 420 (see FIG. 4) and the second connection electrodes 421 (see FIG. 4). According to some example embodiments, the first conductive layer 42 may include the first and second sensing electrodes 410 and 420 and the second connection electrodes 421, and the second conductive layer 44 may include the first connection electrodes 411. According to some example embodiments, the first conductive layer 42 may include the first sensing electrodes 410 and the first connection electrodes 411, and the second conductive layer 44 may include the second sensing electrodes 420 and the second connection electrodes 421. In this case, the first sensing electrodes 410 and the first connection electrodes 411 may be provided on the same layer to be integrally connected to each other, and the second sensing electrodes 420 and the second connection electrodes 421 may also be provided on the same layer, and thus, a contact hole may not be provided in an insulating layer between the first conductive layer 42 and the second conductive layer 44.

Although it is shown in FIG. 5 that the touch sensing layer 40 includes the first insulating layer 41, the first conductive layer 42, the second insulating layer 43, the second conductive layer 44, and the third insulating layer 45, according to some example embodiments, the first insulating layer 41 under the first conductive layer 42 may be omitted.

Figure 6:
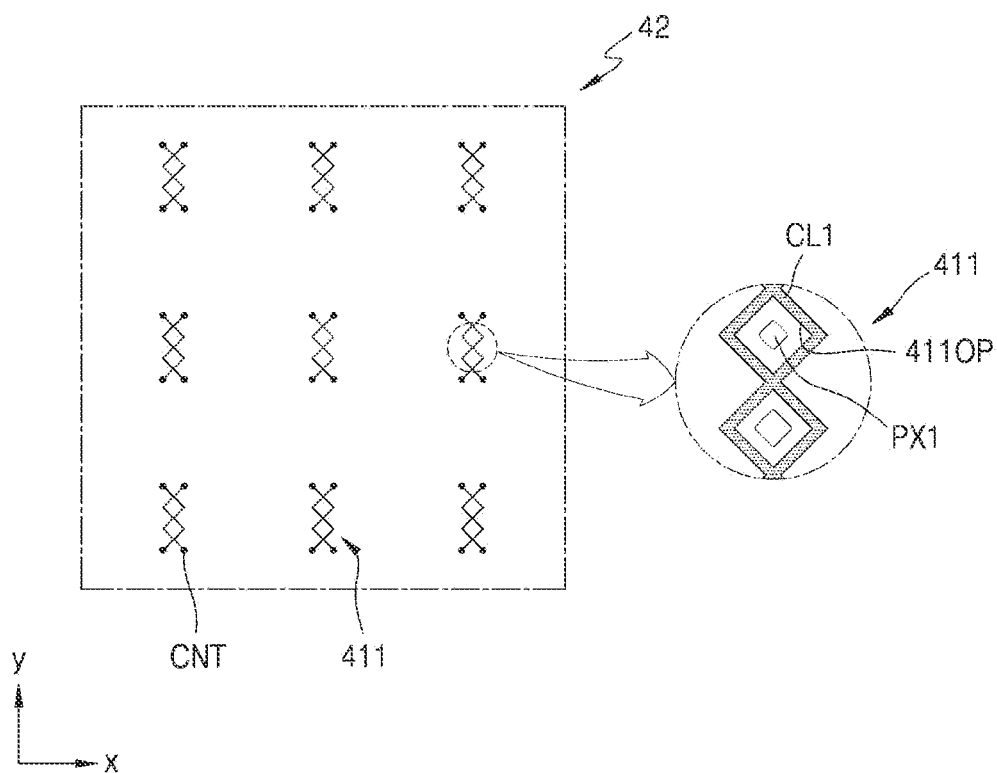
FIG. 6 is a schematic plan view of a first conductive layer of a touch sensing layer included in a display device according to some example embodiments.
Figure 7:
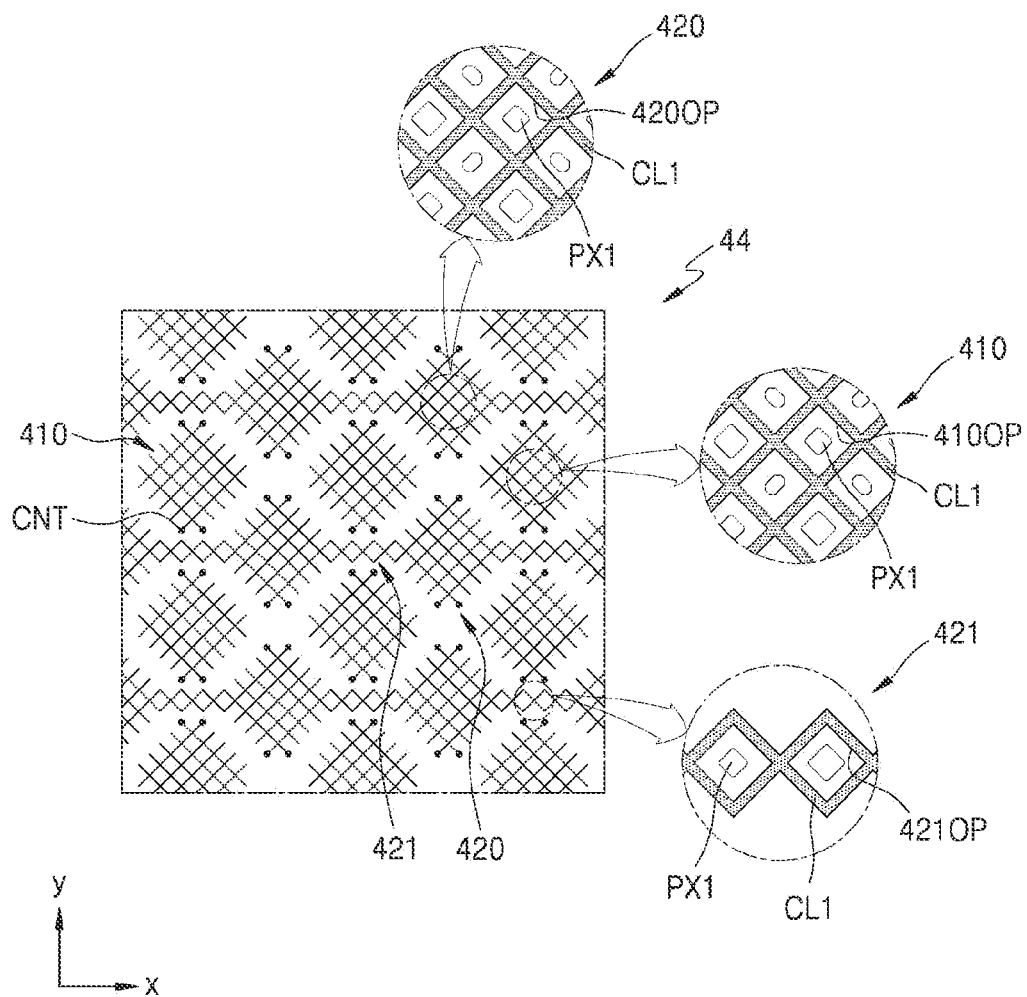
FIG. 7 is a schematic plan view of a second conductive layer of a touch sensing layer included in a display device according to some example embodiments.

FIG. 6 is a schematic plan view of the first conductive layer 42 of the touch sensing layer 40 included in the display device 1 according to some example embodiments, and FIG. 7 is a schematic plan view of the second conductive layer 44 of the touch sensing layer 40 included in the display device 1 according to some example embodiments. FIGS. 6 and 7 illustrate the first conductive layer 42 and the second conductive layer 44 in the first display area DA1 of the touch sensing layer 40, respectively.

Each of the first and second sensing electrodes 410 and 420 and the first and second connection electrodes 411 and 421 may have a mesh (or grid) pattern. When the first and second sensing electrodes 410 and 420 include a metal layer, the first and second sensing electrodes 410 and 420 may have a mesh pattern as shown in FIGS. 6 and 7 in order to prevent the first and second sensing electrodes 410 and 420 from being visible to a user and/or to transmit light emitted from each pixel.

Referring to FIG. 6, the first conductive layer 42 of the touch sensing layer 40 may include the first connection electrode 411. The first connection electrode 411 may include a first conductive line CL1 having a mesh pattern and may include an opening 4110P surrounded by the first conductive line CL1. The opening 4110P may be arranged to overlap the first pixel PX1 of the display panel 10.

The first connection electrodes 411 may electrically connect the first sensing electrodes 410 to each other, the first sensing electrodes 410 being formed on a different layer from the first connection electrodes 411. The first connection electrode 411 electrically connecting the adjacent first sensing electrodes 410 may be connected to the first sensing electrodes 410 through contact holes CNT formed in the second insulating layer 43 (see FIG. 5).

Referring to FIG. 7, the second conductive layer 44 of the touch sensing layer 40 may include a first sensing electrode 410, a second sensing electrode 420, and a second connection electrode 421. The first sensing electrode 410, the second sensing electrode 420, and the second connection electrode 421 may include a first conductive line CL1 having a mesh pattern, and may include openings 4100P, 4200P, and 4210P surrounded by the first conductive line CL1, respectively. The openings 4100P, 4200P, and 4210P may be arranged to overlap the first pixel PX1 of the display panel 10.

The second sensing electrodes 420 may be connected to each other by the second connection electrodes 421 formed on the same layer as the second sensing electrodes 420. For example, the second sensing electrodes 420 may include the same material as the second connection electrodes 421 and may be integrally formed therewith.

The first sensing electrodes 410 may be electrically connected to each other by the first connection electrodes 411 formed on a different layer from the first sensing electrodes 410. The first sensing electrodes 410 may be connected to the first sensing electrodes 410 through the contact holes CNT formed in the second insulating layer 43 (see FIG. 5).

Figure 8:
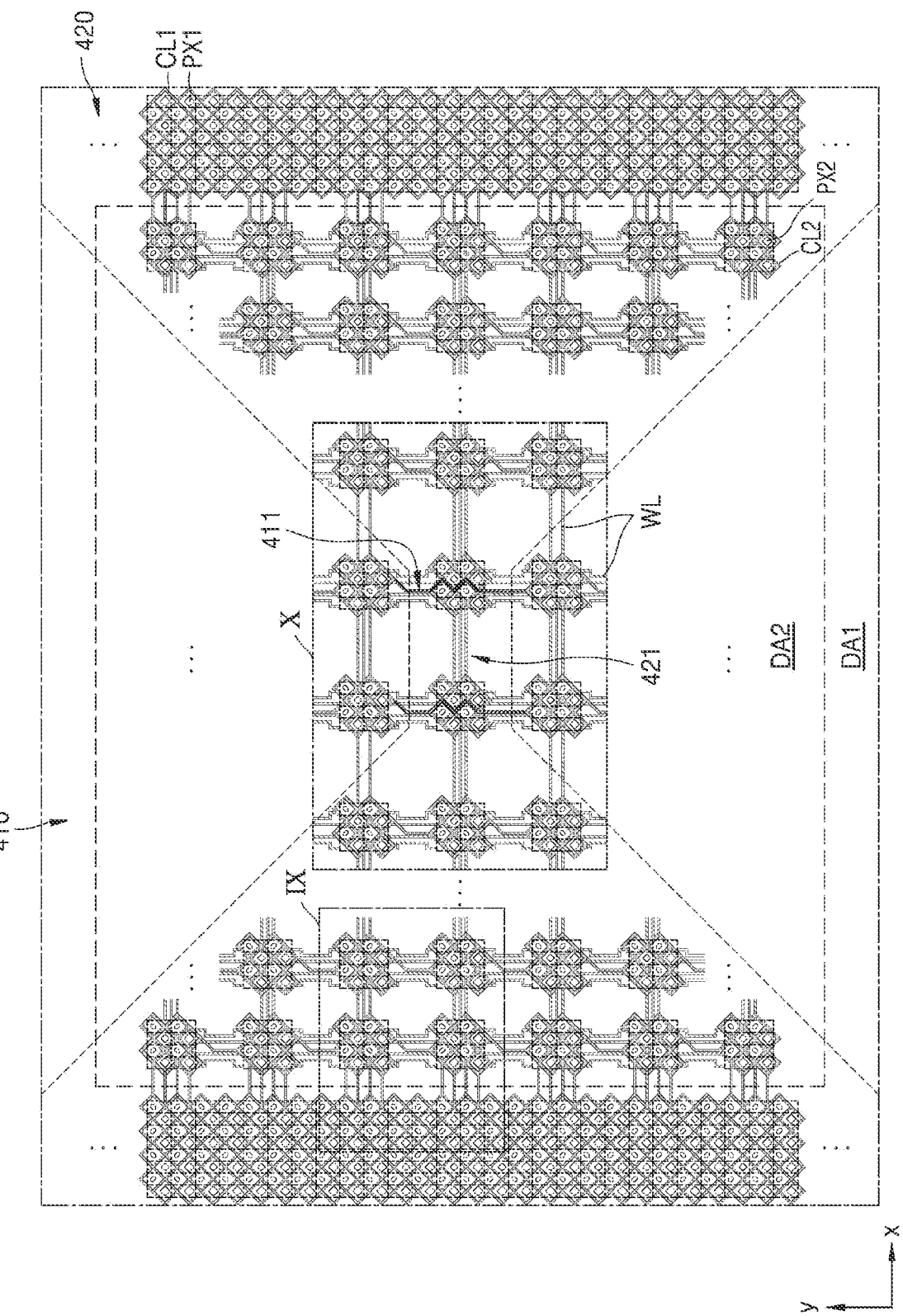
FIG. 8 is a schematic enlarged plan view of a display device according to some example embodiments.

FIG. 8 is a schematic enlarged plan view of the display device 1 according to some example embodiments. FIG. 8 illustrates the second display area DA2 of the display device 1 and the touch sensing layer 40 arranged in a portion of the first display area DA1 adjacent to the second display area DA2.

Referring to FIG. 8, a first pixel array in which a plurality of first pixels PX1 are two-dimensionally arranged in an x-direction and a y-direction that is different from the x-direction may be located in the first display area DA1. A second pixel array in which a plurality of second pixels PX2 are two-dimensionally arranged in the x-direction and y-direction and are spaced apart from each other with a transmission area therebetween may be located in the second display area DA2.

The number of first pixels PX1 in the first display area DA1 per the same area may be greater than the number of second pixels PX2 in the second display area DA2 per the same area. Accordingly, a resolution of a first image provided in the first display area DA1 may be higher than a resolution of a second image provided in the second display area DA2.

As described with reference to FIGS. 6 and 7, a plurality of electrodes including first conductive lines CL1 and second conductive lines CL2 having a mesh pattern may be arranged on the display panel 10 including the plurality of pixels PX.

At least one of the first sensing electrode 410, the second sensing electrode 420, the first connection electrode 411, and the second connection electrode 421 may at least partially overlap the second display area DA2. According to some example embodiments, it is shown in FIG. 8 that the first sensing electrode 410, the second sensing electrode 420, the first connection electrode 411, and the second connection electrode 421 at least partially overlap the second display area DA2.

Referring to FIG. 8, the first sensing electrodes 410 arranged in the y-direction and the second sensing electrodes 420 arranged in the x-direction may be arranged over a boundary between the first display area DA1 and the second display area DA2. In addition, a first connection electrode 411 and a second connection electrode 421 may be arranged in the second display area DA2.

As a comparative example, a plurality of electrodes may not be arranged in the second display area DA2. In this case, coordinate information according to an external input, for example, a touch event, may not be obtained in the second display area DA2. In addition, the sensing sensitivity may be deteriorated in an area of the first display area DA1 adjacent to the second display area DA2.

However, according to some example embodiments, because a plurality of electrodes are arranged in the second display area DA2 as well as the first display area DA1, coordinate information according to a touch event may be obtained in the second display area DA2. Further, the deterioration of sensing sensitivity that may occur in the area of the first display area DA1 adjacent to the second display area DA2 may be prevented or minimized.

Wires WL electrically connecting the pixel circuits PC (see FIG. 3) included in the display panel 10 may be arranged in the second display area DA2.

Hereinafter, the arrangements of a pixel, a transmission area, a wiring area, and a touch sensing layer will be described in more detail with reference to FIGS. 9 and 10.

Figure 9:
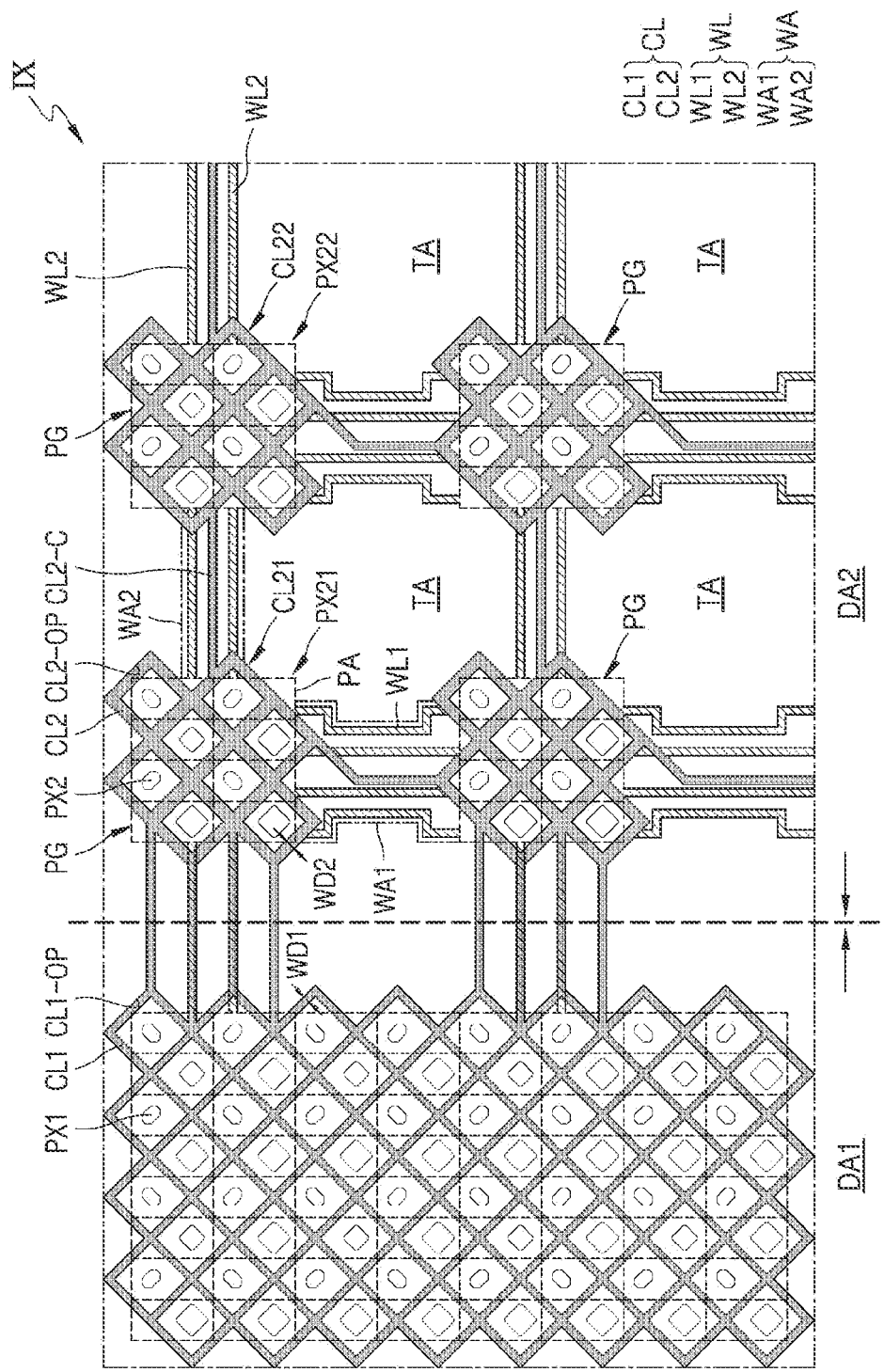
FIG. 9 is a schematic enlarged plan view of a display device according to some example embodiments, illustrating arrangements of a pixel, a transmission area, a wiring area, and a touch sensing layer included in the display device.

FIG. 9 is a schematic enlarged plan view of the display panel 10 according to some example embodiments, illustrating arrangements of a pixel, a transmission area, a wiring area, and a touch sensing layer included in the display panel 10. FIG. 9 may correspond to a region IX of FIG. 8.

Referring to FIG. 9, the plurality of second pixels PX2 arranged in the second display area DA2 may be grouped in a preset unit to constitute one pixel group PG. For example, in FIG. 9, 8 second pixels PX2 are defined to constitute one pixel group PG, but the embodiments according to the present disclosure are not limited thereto. The number of second pixels PX2 constituting one pixel group PG may be modified according to a resolution of the second display area DA2.

Referring to FIG. 9, pixel groups PG formed by the plurality of second pixels PX2 may include a first group of second pixels PX21 and a second group of second pixels PX22, and the first group of second pixels PX21 and the second group of second pixels PX22 may be spaced apart from each other with a transmission area TA therebetween. The first group of second pixels PX21 and the second group of second pixels PX22 may be two-dimensionally arranged in the x-direction and the y-direction. The pixel groups PG and transmission areas TA are repeatedly arranged, and thus, the second pixel array may be formed.

A plurality of wires WL electrically connecting the pixel circuits PC (see FIG. 3) respectively corresponding to the second pixels PX2 may be arranged in the second display area DA2. The wires WL include at least one first wire WL1 and at least one second wire WL2 that extend in a direction intersecting each other. The first wire WL1 may include the data line DL (see FIG. 3) or the driving voltage line PL (see FIG. 3), and the second wire WL2 may include the scan lines SL−1, SL, and SL+1 (see FIG. 3).

The first wire WL1 may be entirely arranged to extend in the y-direction to connect the pixel circuits PC respectively corresponding to the second pixels PX2 arranged in the same column. The second wire WL2 may be entirely arranged to extend in the x-direction to connect the pixel circuits PC respectively corresponding to the second pixels PX2 arranged in the same row. The x-direction and the y-direction may be orthogonal to each other or may be different directions that are not orthogonal to each other.

The transmission area TA may be defined as an area of the second display area DA2 excluding a pixel area PA where the second pixels PX2 and the pixel circuits PC corresponding thereto are located and a wiring area WA where the wires WL are located.

The wiring area WA may include a first wiring area WA1 and a second wiring area WA2, the first wiring area WA1 may include an area where at least one first wire WL1 is located and an area between adjacent first wires WL1, and the second wiring area WA2 may include an area where at least one second wire WL2 is located and an area between adjacent second wires WL2. Referring to FIG. 9, the pixel area PA is indicated by a dotted line, and the wiring area WA is indicated by a two-dot line. A shape of the transmission area TA may be variously formed such as a polygon including a quadrangle, a circle, an ellipse, and a diamond according to arrangements and shapes of the second pixels PX2 and the wires WL.

Referring to FIG. 9, the touch sensing layer 40 (see FIG. 4) may be arranged on the display panel 10, and the touch sensing layer 40 (see FIG. 4) may include a plurality of electrodes, that is, first sensing electrodes 410 (see FIG. 4), second sensing electrodes 420 (see FIG. 4), first connection electrodes 411 (see FIG. 4), and second connection electrodes 421 (see FIG. 4).

The electrodes may include first conductive lines CL1 arranged on the first display area DA1 and second conductive lines CL2 arranged on the second display area DA2. The first conductive lines CL1 and the second conductive lines CL2 may include the same material and may be integrally formed therewith.

The first conductive lines CL1 may include a mesh pattern having a plurality of first openings CL1-OP respectively corresponding to at least one first pixel PX1 of the first pixels PX1 arranged on the first display area DA1. The second conductive lines CL2 may include a mesh pattern having a plurality of second openings CL2-OP respectively corresponding to at least one second pixel PX2 of the second pixels PX2 arranged on the second display area DA2. At least one conductive line CL2-C of the second conductive lines CL2 may extend in the y-direction or the x-direction intersecting with the y-direction between adjacent pixel groups PG. The first conductive lines CL1 and the second conductive lines CL2 may include a mesh pattern to prevent the first conductive lines CL1 and the second conductive lines CL2 from being visible to a user when the first conductive lines CL1 and the second conductive lines CL2 include a metal and/or to transmit light emitted from each pixel PX.

The first conductive lines CL1 may be arranged between two adjacent first pixels PX1 of the first pixels PX1, and the second conductive lines CL2 may be arranged between two adjacent second pixels PX2 of the second pixels PX2. The second conductive lines CL2 may include a first group of second conductive lines CL21 arranged between at least two second pixels PX2 of the first group of second pixels PX21 and a second group of second conductive lines CL22 arranged between at least two second pixels PX2 of the second group of second pixels PX22.

For example, referring to FIG. 9, at least one conductive line CL2-C of the second conductive lines CL2 may extend from the first group of second conductive lines CL21 in the x-direction to be connected to the second group of second conductive lines CL22 adjacent thereto. In addition, the at least one conductive line CL2-C of the second conductive lines CL2 may extend in the y-direction from the first group of second conductive lines CL21 to be connected to the second group of second conductive lines CL22 adjacent thereto. That is, the at least one conductive line CL2-C of the second conductive lines CL2 may extend between the first group of second conductive lines CL21 and the second group of second conductive lines CL22 to connect the first group of second conductive lines CL21 to the second group of second conductive lines CL22.

The at least one conductive line CL2-C of the second conductive lines CL2 may be integrally formed with the first group of second conductive lines CL21 and/or the second group of second conductive lines CL22, and may include the same material therewith.

In order to minimize a reduction in an area of the transmission area TA, the second conductive lines CL2 may be arranged to overlap the pixel area PA and the wiring area WA. That is, the first group of second conductive lines CL21 may overlap an area where the first group of second pixels PX21 is located, and the second group of the second conductive lines CL22 may overlap an area where the second group of second pixels PX22 is located. In addition, the at least one conductive line CL2-C of the second conductive lines CL2 that connects the first group of second pixels PX21 to the second group of second pixels PX22 may be arranged adjacent to the first wires WL1 or the second wires WL2, and thus, at least a portion thereof may overlap the first wires WL1 or the second wires WL2. The at least one conductive line CL2-C of the second conductive lines CL2 may overlap the first wiring area WA1 or the second wiring area WA2.

Referring to FIG. 9, a width WD2 of the second conductive line CL2 may be greater than a width WD1 of the first conductive line CL1. The RC delay may affect the sensing sensitivity, and when the width of the conductive lines CL included in the plurality of electrodes is increased, an input area is also increased, which may increase capacitance of the conductive lines CL, thereby improving the sensing sensitivity.

Because the second display area DA2 includes the transmission area TA where the second conductive lines CL2 are not arranged unlike the first display area DA1, an area of the conductive line CL arranged per the same area in the second display area DA2 may be less than an area of the conductive line CL arranged per the same area in the first display area DA1 per the same area. Therefore, sensing sensitivity in the second display area DA2 may be lower than sensing sensitivity in the first display area DA1. In order to solve this issue, the width WD2 of the second conductive line CL2 arranged in the second display area DA2 may be formed greater than the width WD1 of the first conductive line CL1 arranged in the first display area DA1, and thus, the sensing sensitivity in the second display area DA2 may be improved.

Figure 10:
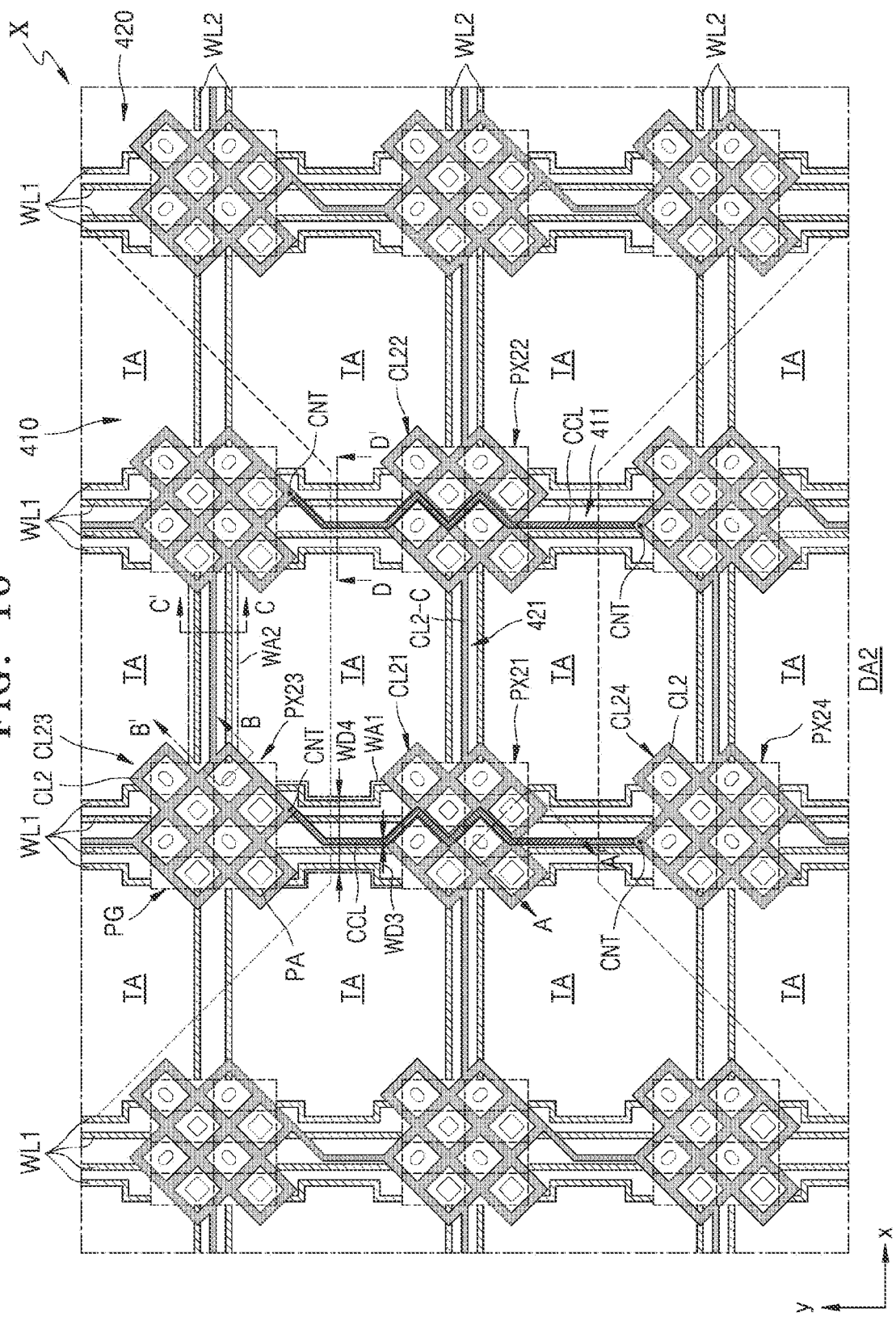
FIG. 10 is a schematic enlarged plan view of a display device according to some example embodiments, illustrating arrangements of a pixel, a transmission area, a wiring area, and a touch sensing layer included in a display panel.

FIG. 10 is a schematic enlarged plan view of the display device 1 according to some example embodiments, illustrating arrangements of a pixel, a transmission area, a wiring area, and a touch sensing layer included in the display panel 10. FIG. 10 may correspond to a region X of FIG. 9. The arrangements of the second pixels PX2, the transmission area TA, and the wires WL in the second display area DA2 are the same as those described with reference to FIG. 9, differences therebetween will be mainly described below.

Referring to FIG. 10, a pixel group PG formed by a plurality of second pixels PX2 may include a first group of second pixels PX21 and a second group of second pixels PX22 arranged in the x-direction. In addition, the pixel group PG may include a third group of second pixels PX23 and a fourth group of second pixels PX24 arranged in the y-direction different from the x-direction.

For example, in FIG. 10, the first group of second pixels PX21 is arranged between the third group of second pixels PX23 and the fourth group of second pixels PX24. The second group of second pixels PX22 may be arranged adjacent to the first group of second pixels PX21 in the x-direction. The second group of second pixels PX22 may be arranged between the third group of second pixels PX23 and the fourth group of second pixels PX24. In this case, the first group of second pixels PX21 may be arranged adjacent to the second group of second pixels PX22 in the x-direction.

The second conductive lines CL2 may include a third group of second conductive lines CL23 located between at least two second pixels PX2 of the third group of second pixels PX23. In addition, the second conductive lines CL2 may include a fourth group of second conductive lines CL24 located between at least two second pixels PX2 of the fourth group of second pixels PX24.

The touch sensing layer 40 may include a connection conductive line CCL that may electrically connect the third group of second conductive lines CL23 to the fourth group of second conductive lines CL24. For example, referring to FIG. 10, the connection conductive line CCL may extend from the third group of second conductive lines CL23 in the y-direction to be connected to the fourth group of second conductive lines CL24. The connection conductive line CCL may include the same material as the second conductive lines CL2. The connection conductive line CCL may be included in the first connection electrode 411 described with reference to FIG. 4.

The connection conductive line CCL may be arranged adjacent to the first wire WL1, and at least a portion thereof may overlap the first wire WL1. The connection conductive line CCL may be arranged to overlap the first wiring area WA1. Further, a width WD3 of the connection conductive line CCL may be less than a width WD4 of the first wiring area WA1. Accordingly, a reduction in the area of the transmission area TA due to the connection conductive line CCL may be prevented or minimized.

The connection conductive line CCL may extend through the first group of second pixels PX21 or the second group of second pixels PX22 arranged between the third group of second pixels PX23 and the fourth group of second pixels PX24. The connection conductive line CCL may overlap the first group of second conductive lines CL21 or the second group of second conductive lines CL22. Accordingly, the connection conductive line CCL may be prevented from overlapping the second pixels PX2 and blocking light emitted from the second pixels PX2.

In FIG. 10, at least one conductive line CL2-C of second conductive lines CL2 connecting the first group of second conductive lines CL21 to the second group of second conductive lines CL22 may be included in the second connection electrode 421 described with reference to FIG. 4. In addition, second conductive lines CL2 connecting adjacent second sensing electrodes 420 may be included in the second connection electrode 421.

An insulating layer may be arranged between the connection conductive line CCL and the third group of second conductive lines CL23 and between the connection conductive line CCL and the fourth group of second conductive lines CL24. The connection conductive lines CCL may be connected to the third group of second conductive lines CL23 and the fourth group of second conductive lines CL24 through contact holes CNT of the insulating layer, respectively. The insulating layer may be the second insulating layer 43 (see FIG. 5). In order to secure a sufficient connection area, the contact holes CNT may be positioned to overlap the third group of second conductive lines CL23 and the fourth group of second conductive lines CL24.

Figure 11:
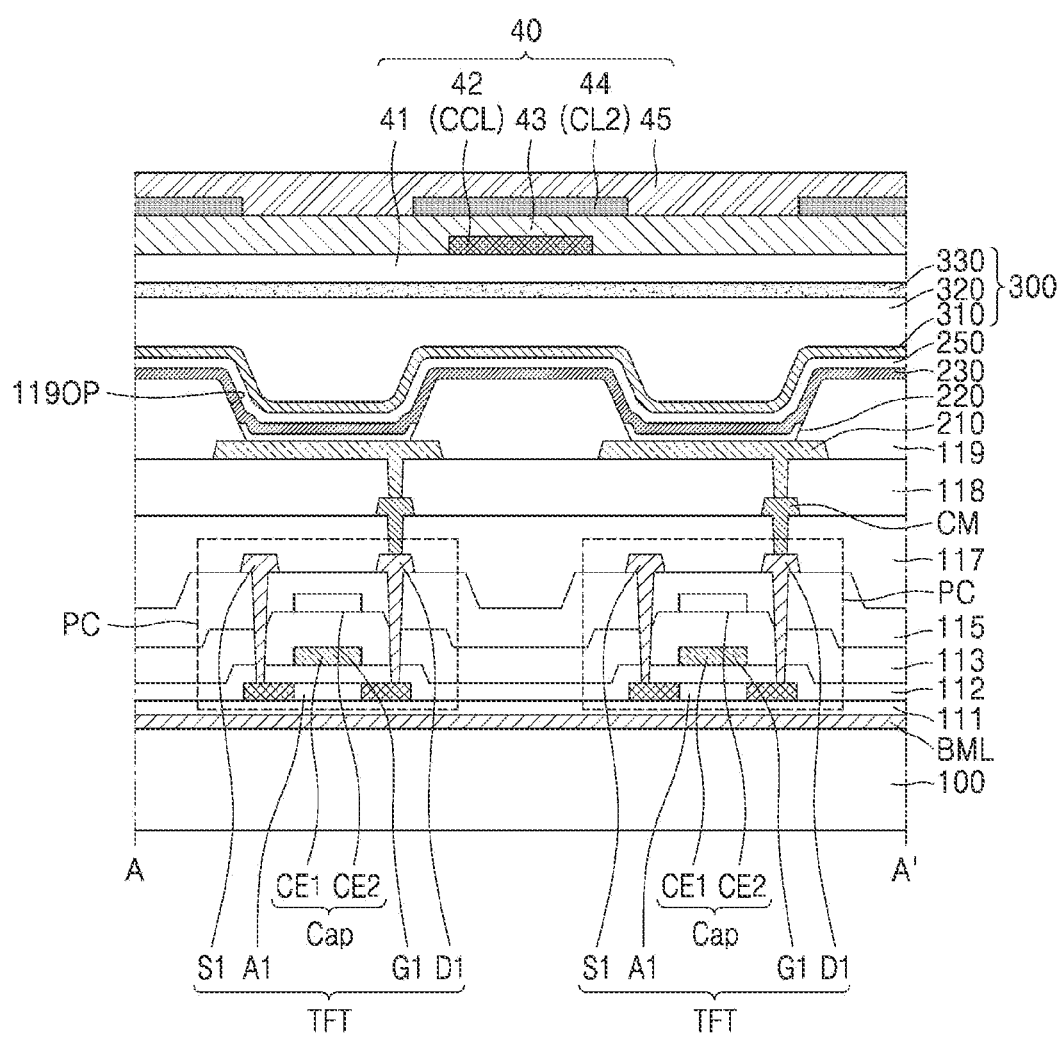
FIG. 11 is a schematic cross-sectional view of a portion of a display device according to some example embodiments, illustrating arrangements of a first conductive layer and a second conductive layer of a touch sensing layer.

FIG. 11 is a schematic cross-sectional view of the display device according to some example embodiments, illustrating arrangements of a first conductive layer and a second conductive layer of the touch sensing layer 40.

Referring to FIG. 11, the substrate 100 may be a transparent insulating substrate including materials such as glass and quartz and have a single-layered structure. According to some example embodiments, the substrate 100 may have a multi-layered structure including a base layer and an inorganic layer, the base layer including a polymer resin.

A buffer layer 111 may be arranged over the substrate 100. The buffer layer 111 may reduce or block the penetration of foreign substances, moisture, or external air from below the substrate 100 and provide a flat surface on the substrate 100. The buffer layer 111 may include an inorganic insulating material such as silicon oxide, silicon oxynitride, and silicon nitride and have a single-layered or multi-layered structure including the above materials.

The pixel circuit PC may be arranged on the buffer layer 111, the pixel circuit PC including the thin-film transistor TFT and the storage capacitor Cap. The pixel circuits PC may be respectively arranged in the first display area DA1 and the second display area DA2. The pixel circuit PC in the first display area DA1 and the pixel circuit PC in the second display area DA2 may have the same structure.

The light-blocking layer BML may be arranged between the pixel circuit PC arranged in the second display area DA2 and the substrate 100. Though it is shown in FIG. 11 that the light-blocking layer BML is arranged between the substrate 100 and the buffer layer 111, the light-blocking layer BML may be arranged between the plurality of sub-layers constituting the substrate 100. The light-blocking layer BML may include a light-blocking material. e.g. a metal, black ink, dye, etc.

The light-blocking layer BML may prevent light that is emitted from the electronic component 20 or directed to the electronic component 20 from being diffracted through a narrow slit between wires connected to the pixel circuit PC (see FIG. 3) and prevent light that is emitted from the electronic component 20 from being incident to the pixel circuit PC. Accordingly, the performance of the thin-film transistor TFT may be improved. The light-blocking layer BML may be connected to at least one of a source electrode, a drain electrode, and a gate electrode of the thin-film transistor and may be arranged in a floating state according to some example embodiments.

The thin-film transistor TFT may include a semiconductor layer A1, a gate electrode G1, a source electrode S1, and a drain electrode D1, the gate electrode G1 overlapping a channel region of the semiconductor layer A1, and the source electrode S1 and the drain electrode D1 being respectively connected to a source region and a drain region of the semiconductor layer A1. A gate insulating layer 112 is arranged between the semiconductor layer A1 and the gate electrode G1. A first interlayer insulating layer 113 and a second interlayer insulating layer 115 may be arranged between the gate electrode G1 and the source electrode S1 or between the gate electrode G1 and the drain electrode D1.

The storage capacitor Cap may overlap the thin-film transistor TFT. The storage capacitor Cap may include a first capacitor plate CE1 and a second capacitor plate CE2 overlapping each other. According to some example embodiments, the gate electrode G1 of the thin-film transistor TFT may include the first capacitor plate CE1 of the storage capacitor Cap. The first interlayer insulating layer 113 may be arranged between the first capacitor plate CE1 and the second capacitor plate CE2.

The semiconductor layer A1 may include polycrystalline silicon. According to some example embodiments, the semiconductor layer A1 may include amorphous silicon. According to some example embodiments, the semiconductor layer A1 may include an oxide of at least one of indium (In), gallium (Ga), stannum (Sn), zirconium (Zr), vanadium (V), hafnium (Hf), cadmium (Cd), germanium (Ge), chrome (Cr), Ti, and zinc (Zn). The semiconductor layer A1 may include the channel region, the source region, and the drain region, the source region and the drain region being doped with impurities.

The gate insulating layer 112 may include an inorganic insulating material such as silicon oxide, silicon oxynitride, and silicon nitride and have a single-layered or multi-layered structure including the above materials.

The gate electrode G1 or the first capacitor plate CE1 may include a low-resistance conductive material including Mo, Al, Cu, and/or Ti and have a single-layered or multi-layered structure including the above materials.

The first interlayer insulating layer 113 may include an inorganic insulating material such as silicon oxide, silicon oxynitride, and silicon nitride and have a single layered or multi-layered structure including the above materials.

The second capacitor plate CE2 may include Al, platinum (Pt), palladium (Pd), Ag, magnesium (Mg), gold (Au), nickel (Ni), neodymium (Nd), iridium (Ir), Cr, calcium (Ca), Mo, Ti, tungsten (W), and/or Cu and have a single-layered or multi-layered structure including the above materials.

The second interlayer insulating layer 115 may include an inorganic insulating material such as silicon oxide, silicon oxynitride, and silicon nitride and have a single-layered or multi-layered structure including the above materials.

The source electrode S1 or the drain electrode D1 may include Al, Pt, Pd, Ag, Mg, Au, Ni, Nd, Ir, Cr, Ca, Mo, Ti, W, and/or Cu and have a single-layered or multi-layered structure including the above materials. For example, the source electrode S1 or the drain electrode D1 may have a three-layered structure of a Ti layer/Al layer/Ti layer.

The pixel circuit PC may be electrically connected to a pixel electrode 210, the pixel circuit PC including the thin-film transistor TFT and the storage capacitor Cap. According to some example embodiments, as shown in FIG. 11, the pixel circuit PC may be electrically connected to the pixel electrode 210 by a contact metal CM.

The contact metal CM may be arranged on a first planarization insulating layer 117 and connected to the pixel circuit PC through a contact hole formed in the first planarization insulating layer 117. The contact metal CM may include Al, Pt, Pd, Ag, Mg, Au, Ni, Nd, Ir, Cr, Ca, Mo, Ti, W, and/or Cu and have a single-layered or multi-layered structure including the above materials.

The first planarization insulating layer 117 may include an organic insulating material. The first planarization insulating layer 117 may include an organic insulating material such as acryl, benzocyclobutene (BCB), polyimide, and hexamethyldisiloxane (HMDSO). The organic insulating material of the first planarization insulating layer 117 may include a photosensitive organic insulating material.

A second planarization insulating layer 118 is arranged on the contact metal CM. The second planarization insulating layer 118 may include an organic insulating material. The second planarization insulating layer 118 may include an organic insulating material such as acryl, BCB, polyimide, and HMDSO. The organic insulating material of the second planarization insulating layer 118 may include a photosensitive organic insulating material.

The pixel electrode 210 may be arranged on the second planarization insulating layer 118. The pixel electrode 210 may be connected to the contact metal CM through a contact hole of the second planarization insulating layer 118.

The pixel electrode 210 may include a reflective layer including Ag, Mg, Al, Pt, Pd, Au, Ni, Nd, Ir, Cr, or a compound thereof. The pixel electrode 210 may include the reflective layer including the above material and a transparent conductive layer on and/or under the reflective layer. The transparent conductive layer may include ITO, IZO, ZnO, indium oxide ($In_2O_3$), indium gallium oxide (IGO), and aluminum zinc oxide (AZO). According to some example embodiments, the pixel electrode 210 may have a three-layered structure of ITO layer/Ag layer/ITO layer that are sequentially stacked.

A pixel-defining layer 119 may be arranged on the pixel electrode 210. The pixel-defining layer 119 may cover edges of the pixel electrode 210 and include an opening 1190P overlapping a central portion of the pixel electrode 210.

The pixel-defining layer 119 may prevent an arc, etc. from occurring at the edges of the pixel electrode 210 by increasing a distance between the edges of the pixel electrode 210 and an opposite electrode 230 over the pixel electrode 210. The pixel-defining layer 119 may include an organic insulating material such as polyimide, polyamide, an acrylic resin, BCB, HMDSO, and a phenolic resin. The pixel-defining layer 119 may be formed by a method such as spin coating.

An intermediate layer 220 is arranged on the pixel-defining layer 119 to correspond to the pixel electrode 210. The intermediate layer 220 may include a polymer organic material or a low molecular weight organic material emitting light having a color (e.g., a set or predetermined color).

The opposite electrode 230 is arranged on the intermediate layer 220. The opposite electrode 230 may include a conductive material having a relatively low work function. For example, the opposite electrode 230 may include a (semi)-transparent layer including Ag, Mg, Al, Ni, Cr, lithium (Li), Ca, or an alloy thereof. Alternatively, the opposite electrode 230 may further include a layer including ITO, IZO, ZnO, or $In_2O_3$ on/under the (semi)-transparent layer including the above materials. According to some example embodiments, the opposite electrode 230 may include Ag and Mg. The opposite electrode 230 may be formed as one body to entirely cover the first and second display areas DA1 and DA2 (see FIG. 1).

A stacked structure of the pixel electrode 210, the intermediate layer 220, and the opposite electrode 230 that are stacked may constitute a light-emitting diode, for example, an organic light-emitting diode OLED. The organic light-emitting diode OLED may emit red, green, or blue light. An emission area of each organic light-emitting diode OLED corresponds to a pixel. For example, the first pixel PX1 corresponds to an emission area of an organic light-emitting diode OLED arranged in the first display area DA1, and the second pixel PX2 corresponds to an emission area of an organic light-emitting diode OLED arranged in the second display area DA2. Because the opening 1190P of the pixel-defining layer 119 defines a size and/or a width of an emission area, a size and/or a width of the first pixel PX1 and the second pixel PX2 may depend on the opening 1190P of the pixel-defining layer 119.

A capping layer 250 may be formed on the opposite electrode 230. The capping layer 250 may include lithium fluoride (LiF). Alternatively, the capping layer 250 may include an inorganic insulating material such as silicon nitride and/or include an organic insulating material. According to some example embodiments, the capping layer 250 may be omitted.

The thin-film encapsulation layer 300 may be arranged on the capping layer 250. The organic light-emitting diode OLED may be covered by the thin-film encapsulation layer 300. The thin-film encapsulation layer 300 may include the first and second inorganic encapsulation layers 310 and 330 and the organic encapsulation layer 320 therebetween.

Each of the first and second inorganic encapsulation layers 310 and 330 may include at least one inorganic insulating material. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by chemical vapor deposition.

The organic encapsulation layer 320 may include a polymer-based material. The polymer-based material may include an acryl-based resin, an epoxy-based resin, polyimide, and polyethylene. For example, the organic encapsulation layer 320 may include an acryl-based resin, for example, polymethyl methacrylate, a polyacrylic acid, etc. The organic encapsulation layer 320 may be formed by hardening a monomer or coating a polymer.

The touch sensing layer 40 may be arranged on the thin-film encapsulation layer 300. The touch sensing layer 40 may include the first insulating layer 41, the first conductive layer 42, the second insulating layer 43, the second conductive layer 44, and the third insulating layer 45 that are sequentially stacked as described above with reference to FIG. 5.

In FIG. 11, the first conductive layer 42 may include the first connection electrode 411 (see FIG. 10), and the first connection electrode 411 (see FIG. 10) may include the connection conductive line CCL. The connection conductive line CCL may be arranged to overlap the pixel-defining layer 119 located between adjacent second pixels PX2. In addition, the second conductive layer 44 may include the second sensing electrode 420 (see FIG. 10) and may be the second conductive lines CL2 included in the second sensing electrode 420. The second conductive lines CL2 may be arranged to overlap the pixel-defining layer 119. Accordingly, the second conductive lines CL2 may be arranged to correspond to the pixel-defining layer 119 located between two adjacent second pixels PX2 among the plurality of second pixels PX2 constituting the pixel groups PG described with reference to FIG. 10. According to some example embodiments, the first conductive lines CL1 may be arranged to overlap the pixel-defining layer 119 located between the first pixels PX1 in the first display area DA1. Accordingly, blocking of light emitted from an emission area of the organic light-emitting diode OLED may be prevented or minimized.

Figure 12:
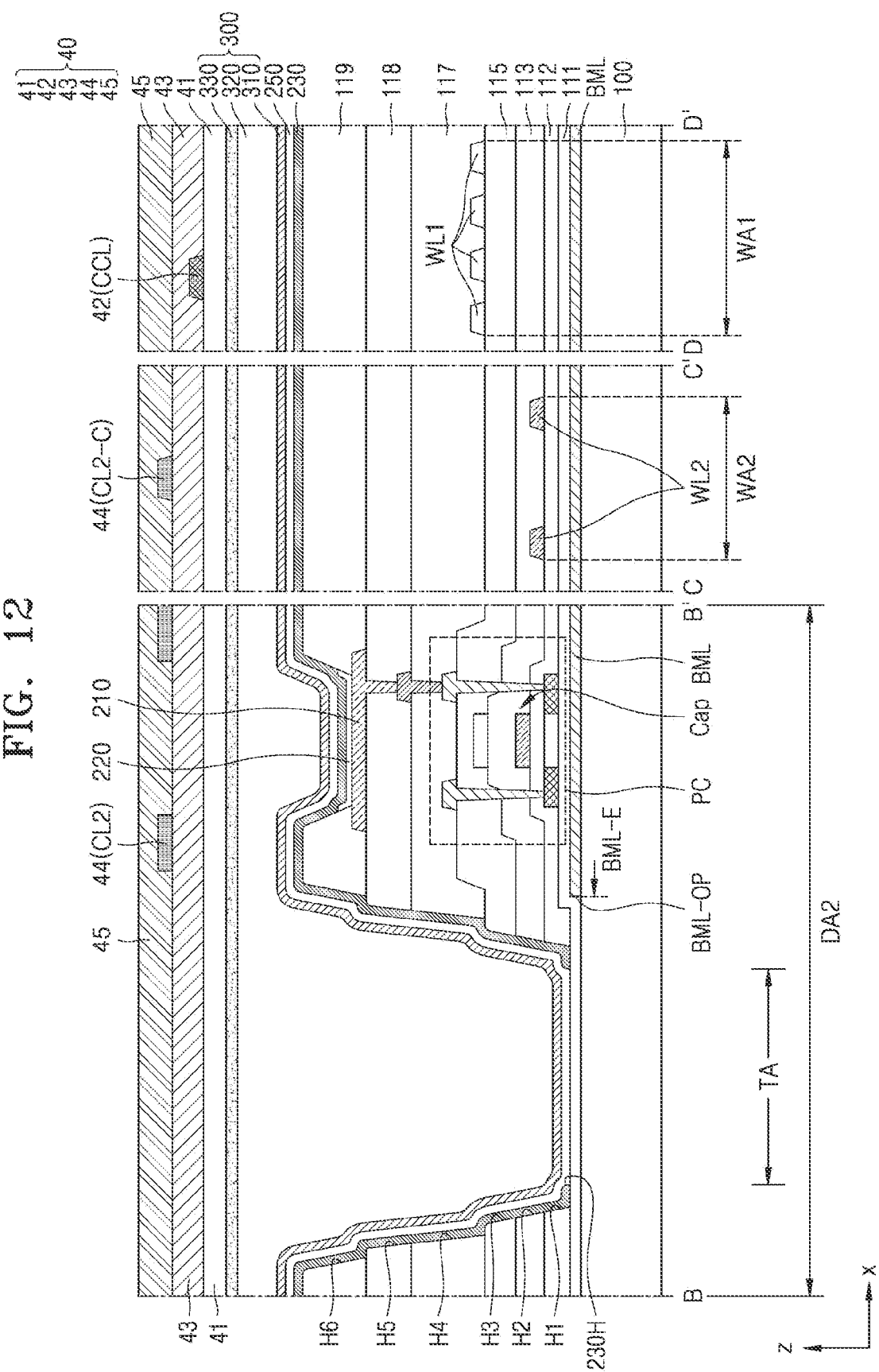
FIG. 12 is a schematic cross-sectional view of a portion of a display device according to some example embodiments, illustrating arrangements of a first conductive layer, a second conductive layer, a first wire, and a second wire of a touch sensing layer.

FIG. 12 is a schematic cross-sectional view of the display device according to some example embodiments, illustrating arrangements of the first conductive layer 42 and the second conductive layer 44 of the touch sensing layer 40. FIG. 12 may correspond to the cross-section of the display device taken along the line B-B', the cross-section of the display device taken along C-C', and the cross-section of the display device taken along the line D-D'.

Because the stacked structure of the display panel 10 and the touch sensing layer 40 is the same as that described with reference to FIG. 11, differences therebetween will be mainly described below, and some repetitive description of certain components may be omitted.

Referring to a transmission area TA in the cross-section of the display device taken along line B-B' in FIG. 12, insulating layers on the substrate 100 may each include a hole formed in the transmission area TA. For example, the gate insulating layer 112, the first interlayer insulating layer 113, the second interlayer insulating layer 115, the first planarization insulating layer 117, the second planarization insulating layer 118, and the pixel-defining layer 119 each may be located in the transmission area TA and may respectively include first to sixth holes H1, H2, H3, H4, H5, and H6 that overlap one another. In addition, the opposite electrode 230 may include a hole 230H in the transmission area TA. There is no light-blocking layer BML in the transmission area TA. For example, the light-blocking layer BML may include an opening BML-OP corresponding to the transmission area TA. The opening BML-OP of the light-blocking layer BML may be defined by edges BML-E of the light-blocking layer BML. Through this, a light transmittance of the transmission area TA may be improved. Referring to the touch sensing layer 40 in the cross-section of the display device taken along line B-B' in FIG. 12, the second conductive layer 44 including the second conductive lines CL2 may be arranged on the second insulating layer 43. The second conductive lines CL2 may overlap a pixel-defining layer 119 that covers edges of the pixel electrode 210 located in the second display area DA2. Because the second conductive lines CL2 are not arranged on the transmission area TA, even if the second conductive lines CL2 include a metal layer, deterioration of the light transmittance in the transmission area TA may be prevented. In addition, the second conductive lines CL2 do not overlap the second pixel PX2, and thus, blocking of light emitted from the emission area of the organic light-emitting diode OLED may be prevented or minimized.

The pixel circuit PC, the pixel electrode 210, and the second conductive line CL2 may not overlap the opening BML-OP of the light-blocking layer BML and may be positioned in an area where the light-blocking layer BML is arranged. For example, the edges BML-E of the light-blocking layer BML may be arranged closer to the transmission area TA than to the pixel circuit PC, the pixel electrode 210, and the second conductive line CL2, and edges of the second conductive line CL2 adjacent to the transmission area TA may be on the same line as at least the edges BML-E of the light-blocking layer BML.

Referring to the cross-section of the display device taken along line C-C' in FIG. 12, the second wires WL2 may be arranged on the gate insulating layer 112. An area in which the second wires WL2 are arranged and an area between adjacent second wires WL2 may be defined as a second wiring area WA2. The second wires WL2 may include the scan lines SL, SL−1, and SL+1 (see FIG. 3) or the emission control line EL (see FIG. 3).

At least one conductive line CL2-C of the second conductive lines CL2 may be arranged on the second insulating layer 43. In addition, at least one conductive line CL2-C of the second conductive lines CL2 may be arranged to overlap the second wiring area WA2. Accordingly, because at least one conductive line CL2-C of the second conductive lines CL2 is not arranged on the transmission area TA, deterioration of the light transmittance in the transmission area TA may be prevented.

Referring to the cross-section of the display device taken along line D-D' in FIG. 12, the first wires WL1 may be arranged on the second interlayer insulating layer 115. An area in which the first wires WL1 are arranged and an area between adjacent first wires WL1 may be defined as a first wiring area WA1. The first wires WL1 may include the data line DL (see FIG. 3) or the driving voltage line PL (see FIG. 3).

The connection conductive line CCL may be arranged on the first insulating layer 41. Further, the connection conductive line CCL may be arranged to overlap the first wiring area WA1. Accordingly, because the connection conductive line CCL is not arranged on the transmission area TA, deterioration of the light transmittance in the transmission area TA may be prevented.

The light-blocking layer BML may be arranged on the substrate 100 to correspond to the first and second wiring areas WA1 and WA2. The light-blocking layer BML may prevent light incident on the display panel 10 from being diffracted while passing through a narrow gap between the wires WL and unintentionally incident on the electronic component 20.

Figure 13:
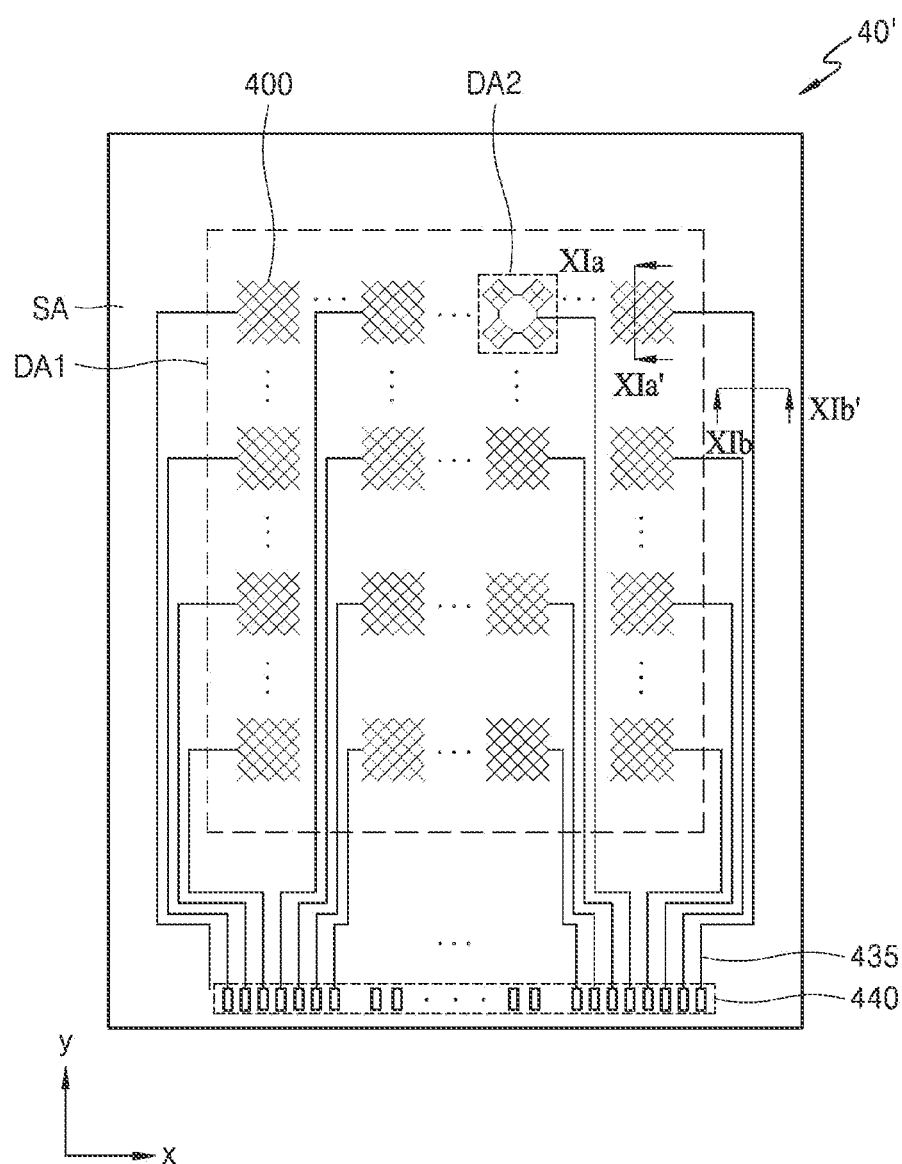
FIG. 13 is a schematic plan view of a touch sensing layer included in a display device according to some example embodiments.

FIG. 13 is a schematic plan view of a touch sensing layer 40' included in the display device according to some example embodiments.

Referring to FIG. 13, the touch sensing layer 40' may include a plurality of sensing electrodes 400 and a plurality of signal lines 435. The sensing electrodes 400 may be arranged in the first display area DA1 and may have unique coordinate information.

For example, the sensing electrodes 400 may be arranged in a matrix form. The sensing electrodes 400 may be arranged around the first display area DA1, and each of the sensing electrodes 400 may be connected to each of the signal lines 435. A portion of the signal line 435 may be arranged in the first display area DA1, and a portion of the signal line 435 may be arranged in the surrounding area SA. The sensing electrodes 400 may obtain coordinate information in a self-cap manner. Each of the sensing electrodes 400 may have a mesh pattern.

Figure 14:
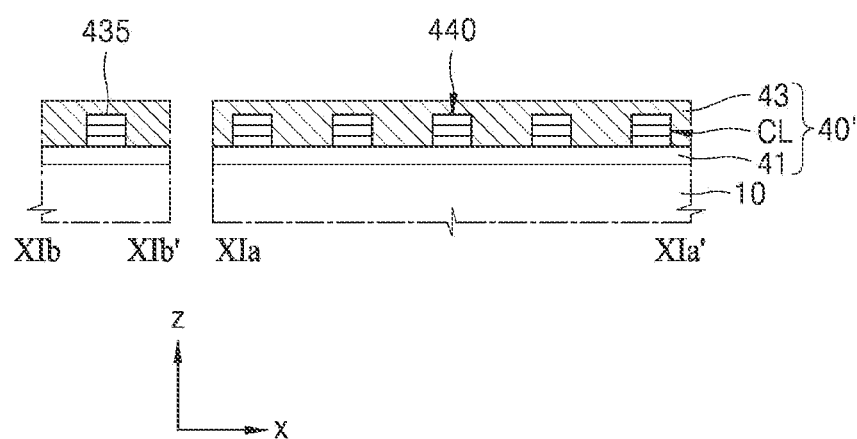
FIG. 14 is a schematic cross-sectional view of a touch sensing layer included in a display device according to some example embodiments.

FIG. 14 is a cross-sectional view of the touch sensing layer 40' included in the display device according to some example embodiments, and is a cross-sectional view of the touch sensing layer 40' taken along the lines XIa-XIa' and XIb-XIb'.

Referring to FIG. 14, the touch sensing layer 40' may be arranged on the display panel 10 and may include the first insulating layer 41, a conductive layer CL including the sensing electrode 400 arranged on the first insulating layer 41, and the second insulating layer 43 covering the conductive layer CL. The conductive layer CL may include the sensing electrodes 400 and the signal lines 435. That is, the sensing electrodes 400 and the signal lines 435 may be formed together in the same process and may include the same material.

The conductive layer CL, for example, the sensing electrodes 400 and the signal lines 435 may include Mo, Mb, Ag, Ti, Cu, Al, and an alloy thereof. The first and second insulating layers 41 and 43 may include an inorganic insulating material and/or an organic insulating material. According to some example embodiments, the first insulating layer 41 may be omitted.

According to one or more embodiments as described above, a display device and an electronic device including the same may be realized, the display device having an extended display area to display an image even in an area where an electronic component is arranged. In particular, a display device and an electronic device including the same may be provided, the display device being capable of obtaining information according to an external input even in an area where an electronic component is arranged and preventing the sensing sensitivity from being deteriorated in a display area adjacent to the area where the electronic component is arranged. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
a substrate including a first display area and a second display area, the second display area including a transmission area;
a first wire extending in a first direction on the first display area;
a plurality of first display elements over the first wire, and located in the first display area;
a plurality of second display elements over the first wire, and located in the second display area; and
a touch sensing layer on at least one of the first display elements and at least one of the second display elements,
wherein the touch sensing layer comprises:
a first conductive member including a plurality of first openings in the first display area, and
a second conductive member including a plurality of second openings in the second display area,
wherein $1\text{-}1^{st}$ openings of the plurality of first openings and $2\text{-}1^{st}$ openings of the plurality of second openings are located on a first virtual line extending in the first direction.

2. The display device of claim 1, wherein $1\text{-}2^{nd}$ openings of the plurality of first openings and $2\text{-}2^{nd}$ openings of the plurality of second openings are located on a second virtual line extending in the first direction, and the transmission area is located between the $2\text{-}1^{st}$ openings and the $2\text{-}2^{nd}$ openings.

3. The display device of claim 2, wherein some of the plurality of first display elements are located between the first virtual line and the second virtual line in the first display area in a plan view.

4. The display device of claim 1, wherein at least a part of the second conductive member is integrally provided with at least a part of the first conductive member.

5. The display device of claim 1, wherein each of the plurality of first openings corresponds to one of the plurality of first display elements.

6. The display device of claim 1, wherein the first wire comprises a scan line.

7. The display device of claim 1, further comprising:
a circuit layer connected to the first wire; and
a light-blocking layer located between the substrate and the circuit layer.

8. The display device of claim 7, wherein the light-blocking layer includes an opening corresponding to the transmission area.

9. The display device of claim 7, wherein the circuit layer comprises an insulating layer including a hole corresponding to the transmission area.

10. The display device of claim 1, wherein the plurality of second openings has a quadrangular shape.

11. An electronic device comprising:
a display device including a first display area and a second display area having a resolution that is different from a resolution of the first display area; and
an electronic component overlapping the second display area,
wherein the display device comprises:
a substrate;
a first wire extending in a first direction on the first display area;
a plurality of first display elements located in the first display area;
a plurality of second display elements located in the second display area; and
a touch sensing layer on at least one of the first display elements and at least one of the second display elements,
wherein the touch sensing layer comprises:
a first conductive member including a plurality of first openings in the first display area, and
a second conductive member including a plurality of second openings in the second display area,
wherein $1\text{-}1^{st}$ openings of the plurality of first openings and $2\text{-}1^{st}$ openings of the plurality of second openings are located on a first virtual line extending in the first direction.

12. The electronic device of claim 11, wherein $1\text{-}2^{nd}$ openings of the plurality of first openings and $2\text{-}2^{nd}$ openings of the plurality of second openings are located on a second virtual line extending in the first direction, and a transmission area is located between the $2\text{-}1^{st}$ openings and the $2\text{-}2^{nd}$ openings.

13. The electronic device of claim 12, wherein some of the plurality of first display elements are located between the first virtual line and the second virtual line in the first display area in a plan view.

14. The electronic device of claim 11, wherein at least a part of the second conductive member is integrally provided with at least a part of the first conductive member.

15. The electronic device of claim 11, wherein each of the plurality of first openings corresponds to one of the plurality of first display elements.

16. The electronic device of claim 11, wherein the first wire comprises a scan line.

17. The electronic device of claim 11, further comprising:
a circuit layer connected to the first wire; and
a light-blocking layer located between the substrate and the circuit layer.

18. The electronic device of claim 17, wherein the light-blocking layer includes an opening corresponding to a transmission area.

19. The electronic device of claim 17, wherein the circuit layer comprises an insulating layer including a hole corresponding to a transmission area.

20. The electronic device of claim 11, wherein the plurality of second openings has a quadrangular shape.

* * * * *